United States Patent [19]

Hyatt

[11] Patent Number: 4,471,385

[45] Date of Patent: Sep. 11, 1984

[54] ELECTRO-OPTICAL ILLUMINATION CONTROL SYSTEM

[76] Inventor: Gilbert P. Hyatt, P.O. Box 4584, Anaheim, Calif. 92803

[21] Appl. No.: 860,278

[22] Filed: Dec. 13, 1977

Related U.S. Application Data

[63] Continuation-in-part of Ser. No. 101,881, Dec. 28, 1970, abandoned, Continuation-in-part of Ser. No. 134,958, Apr. 19, 1971, Continuation-in-part of Ser. No. 135,040, Apr. 19, 1971, Continuation-in-part of Ser. No. 229,213, Apr. 13, 1972, Pat. No. 3,820,894, Continuation-in-part of Ser. No. 230,872, Mar. 1, 1972, Continuation-in-part of Ser. No. 232,459, Mar. 7, 1972, Continuation-in-part of Ser. No. 246,867, Apr. 24, 1972, Pat. No. 4,310,878, Continuation-in-part of Ser. No. 288,247, Sep. 11, 1972, Pat. No. 4,121,284, Continuation-in-part of Ser. No. 291,394, Sep. 22, 1972, Continuation-in-part of Ser. No. 302,771, Nov. 1, 1972, Continuation-in-part of Ser. No. 325,933, Jan. 22, 1973, Pat. No. 4,016,540, Continuation-in-part of Ser. No. 325,941, Jan. 22, 1973, Pat. No. 4,060,848, Continuation-in-part of Ser. No. 366,714, Jun. 4, 1973, Pat. No. 3,986,022, Continuation-in-part of Ser. No. 339,817, Mar. 9, 1973, Pat. No. 4,034,276, Continuation-in-part of Ser. No. 490,816, Jul. 22, 1974, Pat. No. 4,209,853, Continuation-in-part of Ser. No. 476,743, Jun. 5, 1974.

[51] Int. Cl.³ .............................................. H04N 5/66
[52] U.S. Cl. .................................. 358/230; 358/254; 362/373
[58] Field of Search ............... 358/229, 231, 254, 230; 362/84, 373

[56] References Cited

U.S. PATENT DOCUMENTS

| | | | |
|---|---|---|---|
| 2,897,487 | 7/1959 | Owen | 358/254 |
| 3,008,002 | 11/1961 | Kingsbury | 358/229 |
| 3,037,072 | 5/1962 | Mendoza et al. | 358/254 |
| 3,186,115 | 6/1965 | Todt et al. | 358/231 |
| 3,427,458 | 2/1969 | Darfomak et al. | 250/205 |
| 3,473,084 | 10/1969 | Dodge | 315/151 |
| 3,526,711 | 9/1970 | DeBoer | 315/151 |
| 3,558,892 | 1/1971 | Seeley | 315/151 |
| 3,670,202 | 6/1972 | Paine et al. | 315/158 |

(List continued on next page.)

*Primary Examiner*—Richard Murray
*Attorney, Agent, or Firm*—Gilbert P. Hyatt

[57] ABSTRACT

Control of illumination with illumination amplifier devices provides a basis for implementing various types of illumination systems. Also illumination amplifiers in closed illumination servo loops provide improved illumination control. An illumination control system provides precise control of camera operations for photographic and photoplotter applications. Illumination amplifier devices are used in conjunction with electronic control circuits to provide flexibility and precision in camera systems, reducing reliance on prior art mechanical devices.

Illumination control circuits are presented in the form of digital gates and flip-flops and in the form of analog computational elements to provide illumination computer systems. In addition, a batch fabricated illumination computer arrangement is presented for improved implementation of illumination control systems.

Illumination amplifiers are further configured for control of illumination in buildings and automobiles. Various types of devices such as windows, shutters, shades and visors are configured with illumination amplifiers to provide electronic control of illumination.

Batch fabricated display arrangements are provided having an illumination source integral with an illumination amplifier for low cost, small volume, and flexibility. Also, colored display arrangements are provided for control of colors with illumination amplifier devices.

A projection illumination amplifier arrangement is provided having high-intensity large-screen capability and heat transfer design for cooling.

24 Claims, 59 Drawing Figures

U.S. PATENT DOCUMENTS

| | | | |
|---|---|---|---|
| 3,696,344 | 10/1972 | Feinleib et al. | 250/205 |
| 3,705,758 | 12/1972 | Haskal | 331/94.5 |
| 3,713,042 | 1/1973 | Kinsel | 350/160 |
| 3,720,923 | 3/1973 | Chen et al. | 350/160 |
| 3,727,527 | 4/1973 | Borkowski et al. | 350/331 |
| 3,744,906 | 7/1973 | Sato et al. | 250/205 |
| 3,748,853 | 7/1973 | Whitcomb et al. | 350/331 |
| 3,761,617 | 9/1973 | Tsuchiya et al. | |
| 3,764,213 | 10/1973 | O'Meara | 356/5 |
| 3,770,961 | 11/1973 | Westell | 350/331 |
| 3,776,615 | 12/1973 | Tsukamoto et al. | 340/324 R |
| 3,778,791 | 12/1973 | Lewicki et al. | 250/205 |
| 3,790,901 | 2/1974 | White et al. | 250/199 |
| 3,815,982 | 6/1974 | Wagensonner | 350/331 |
| 3,844,650 | 10/1974 | Nicholson et al. | 350/331 |
| 3,883,778 | 5/1975 | Kaji et al. | |
| 3,907,405 | 9/1975 | Fukai et al. | 350/332 |
| 3,989,356 | 11/1976 | Altman | 350/332 |

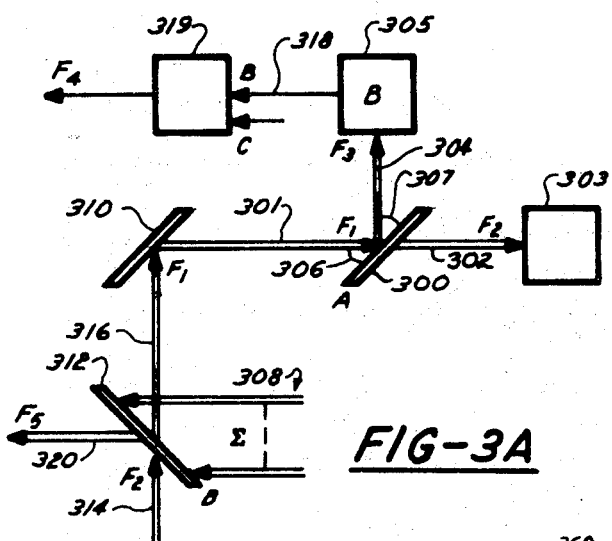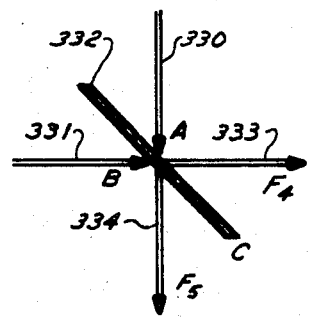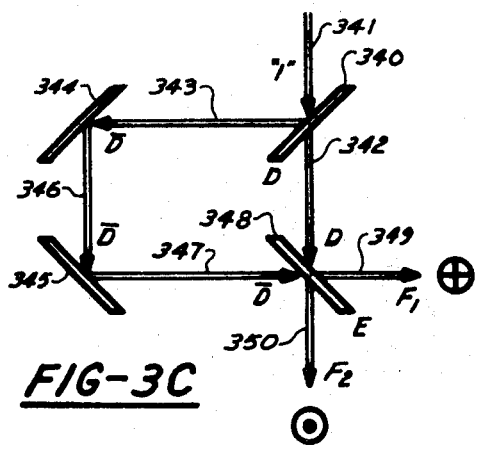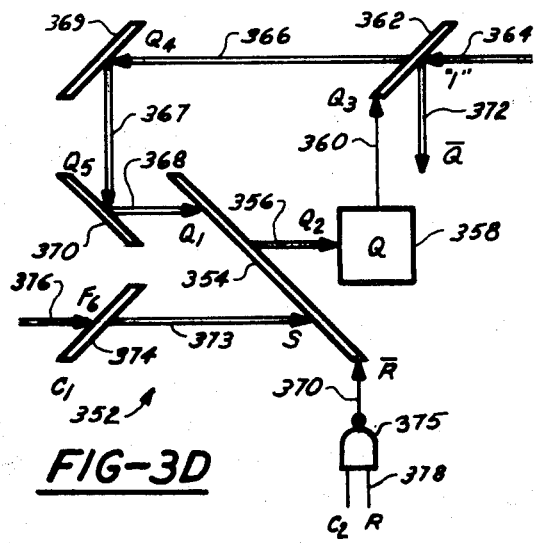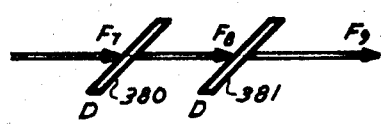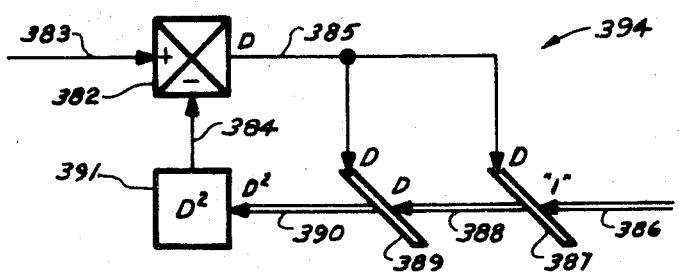

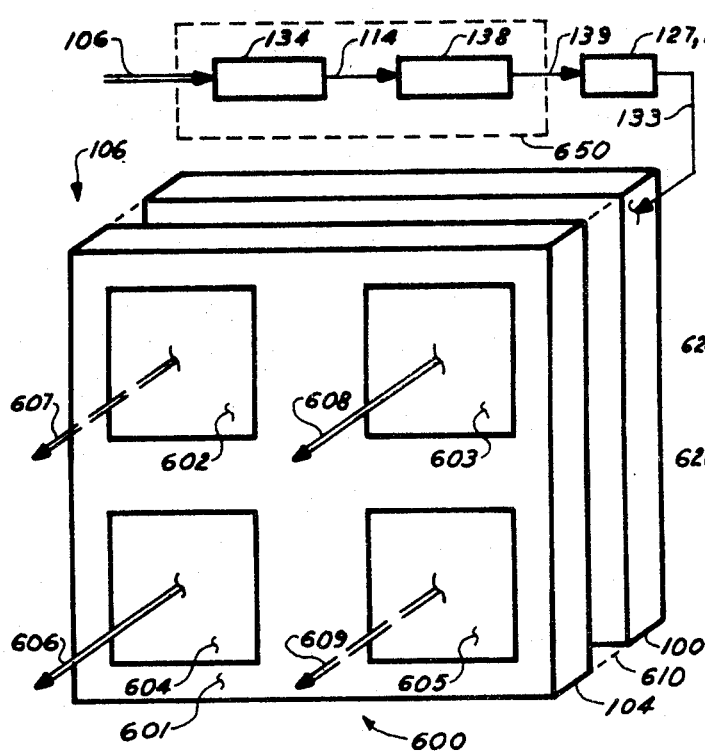
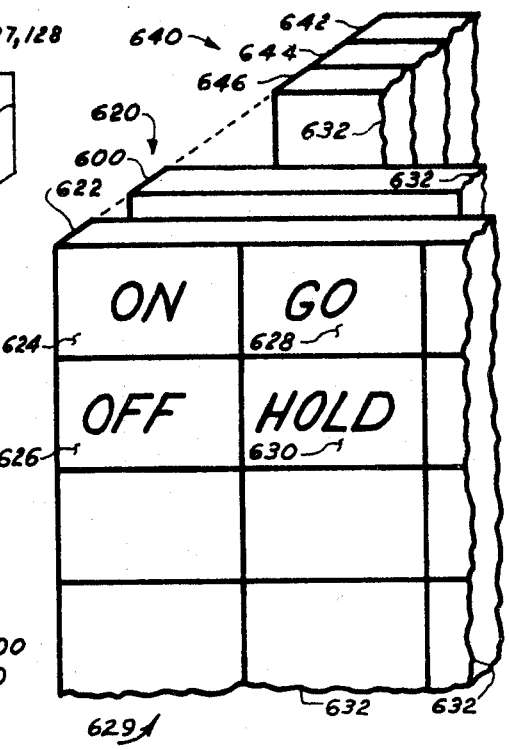
FIG-6A FIG-6B
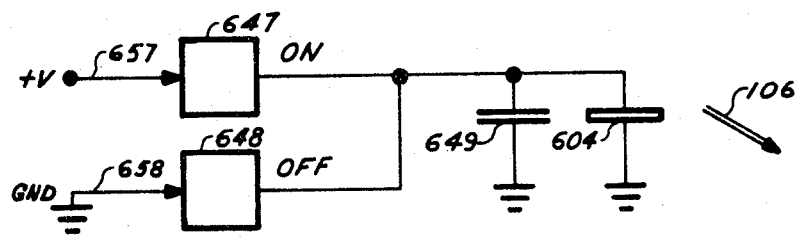
FIG-6C
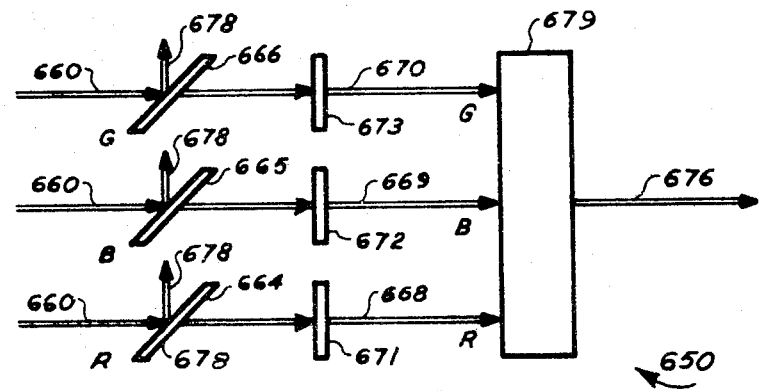
FIG-6D

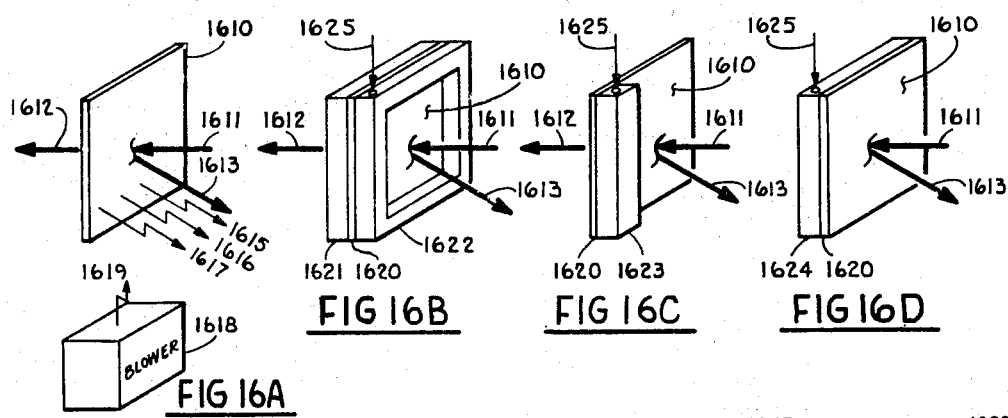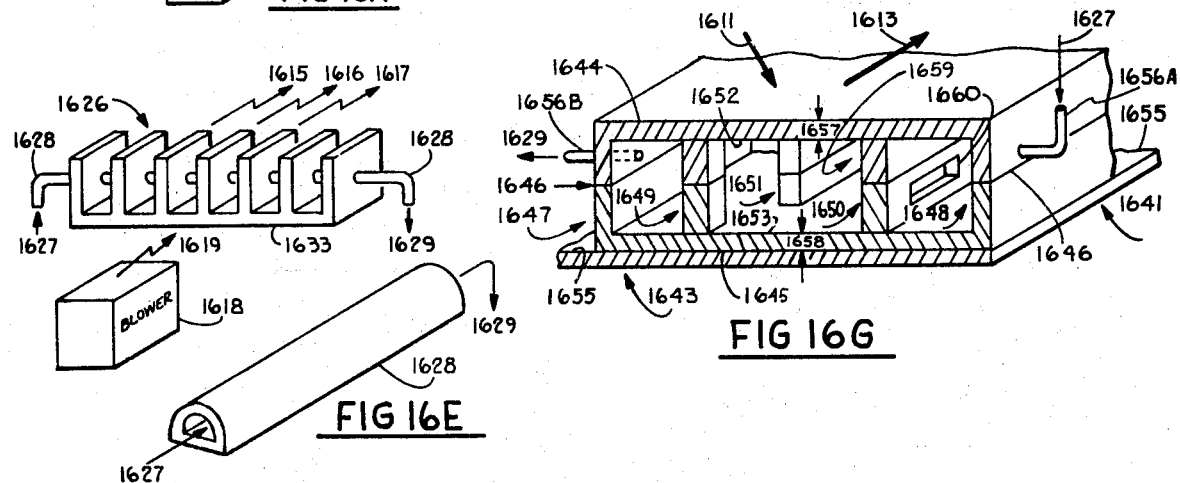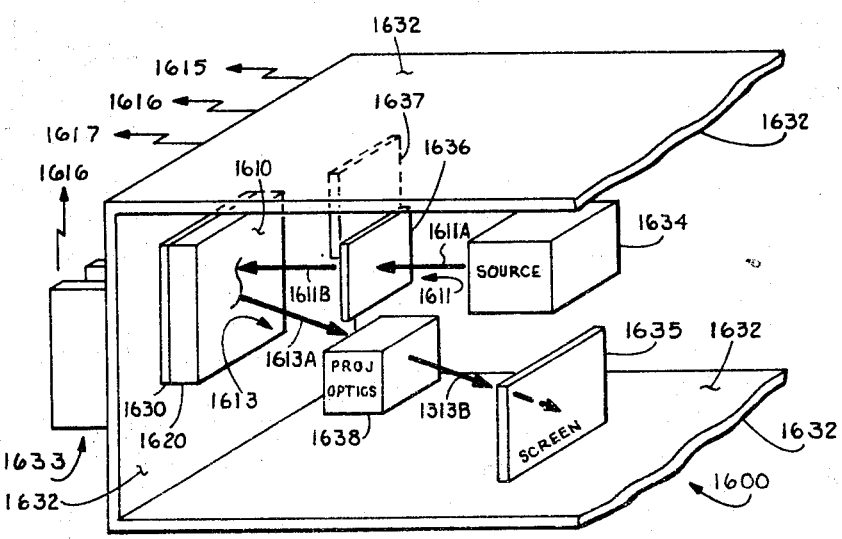

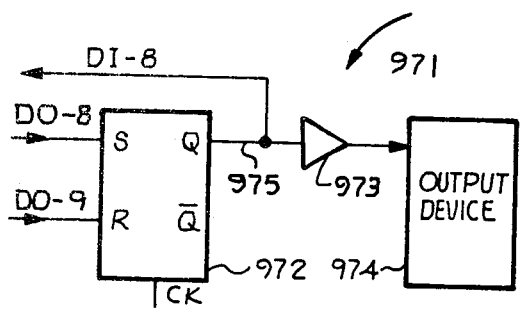
FIG. 17A
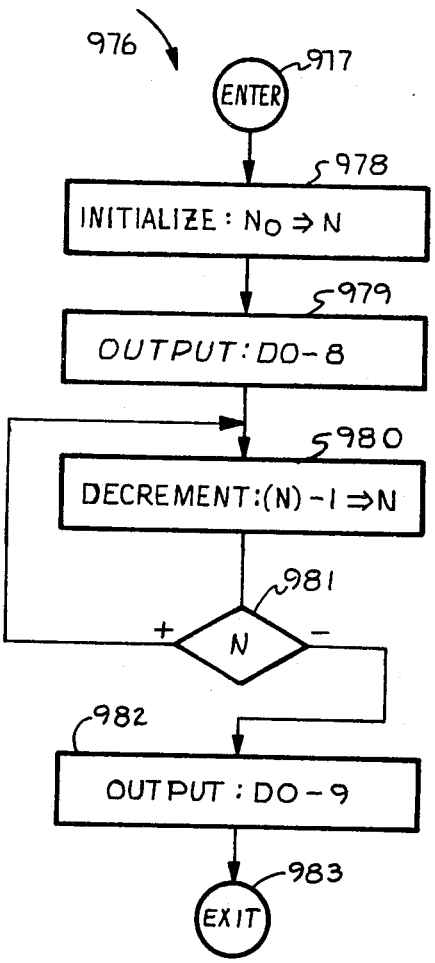
FIG. 17B
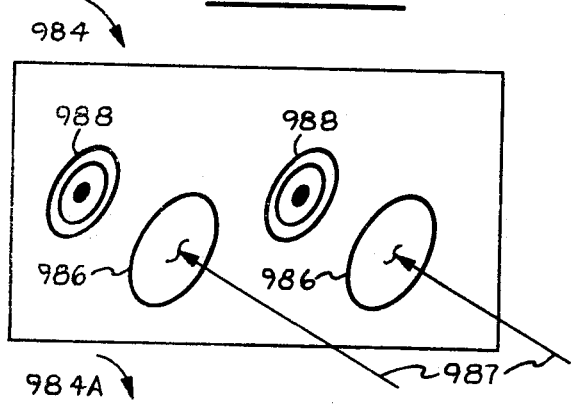
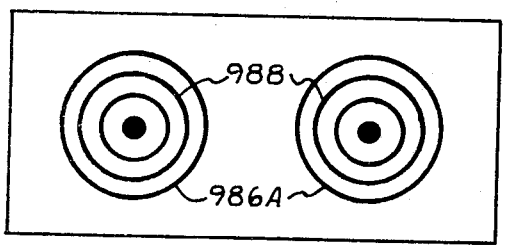
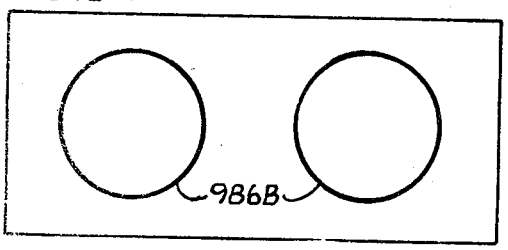
FIG. 17C
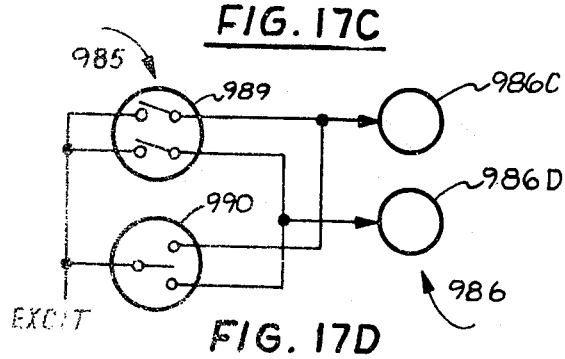
FIG. 17D
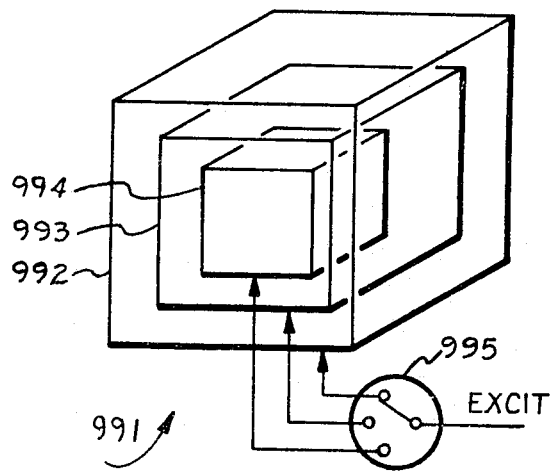
FIG. 17E

ELECTRO-OPTICAL ILLUMINATION CONTROL SYSTEM

CROSS-REFERENCE TO RELATED APPLICATIONS

This application is a continuation-in part of the chain of copending applications:

1. FACTORED DATA PROCESSING SYSTEM FOR DEDICATED APPLICATIONS Ser. No. 101,881 filed on Dec. 28, 1970 now abandoned;
2. CONTROL SYSTEM AND METHOD Ser. No. 134,958 filed on Apr. 19, 1971;
3. CONTROL APPARATUS Ser. No. 135,040 filed on Apr. 19, 1971;
4. APPARATUS AND METHOD FOR PRODUCING HIGH REGISTRATION PHOTO-MASKS Ser. No. 229,213 filed on Apr. 13, 1972 now U.S. Pat. No. 3,820,894 issued on June 28, 1974;
5. MACHINE CONTROL SYSTEM OPERATING FROM REOMTE COMMANDS Ser. No. 230,872 filed on Mar. 1, 1972;
6. COORDINATE ROTATION FOR MACHINE CONTROL SYSTEMS Ser. No. 232,459 filed on Mar. 7, 1972;
7. DIGITAL FEEDBACK CONTROL SYSTEM Ser. No. 246,867 filed on Apr. 24, 1972; now U.S. Pat. No. 4,310,878 issued Jan. 12, 1982.
8. COMPUTERIZED SYSTEM FOR OPERATOR INTERACTION Ser. No. 288,247 filed on Sept. 11, 1972 now U.S. Pat. No. 4,121,284 issued on Oct. 17, 1978;
9. A SYSTEM FOR INTERFACING A COMPUTER TO A MACHINE Ser. No. 291,394 filed on Sept. 22, 1972;
10. DIGITAL ARRANGEMENT FOR PROCESSING SQUAREWAVE SIGNALS Ser. No. 302,771 filed on Nov. 1, 1972;
11. APPARATUS AND METHOD FOR PROVIDING INTERACTIVE AUDIO COMMUNICATION Ser. No. 325,993 filed on Jan. 22, 1973 now U.S. Pat. No. 4,016,540 issued on Apr. 5, 1977;
12. ELECTRONIC CALCULATOR SYSTEM HAVING AUDIO MESSAGES FOR OPERATOR INTERACTION Ser. No. 325,941 filed on Jan. 22, 1973 now U.S. Pat. No. 4,060,848 issued on Nov. 29, 1977;
13. ILLUMINATION CONTROL SYSTEM Ser. No. 366,714 filed on June 4, 1973 now U.S. Pat. No. 3,986,022 issued on Oct. 12, 1976;
14. DIGITAL SIGNAL PROCESSOR FOR SERVO VELOCITY CONTROL Ser. No. 339,817 filed on Mar. 9, 1973 now U.S. Pat. No. 4,034,276 issued on July 5, 1977;
15. HOLOGRAPHIC SYSTEM FOR OBJECT LOCATION AND IDENTIFICATION Ser. No. 490,816 filed on July 22, 1974 now U.S. Pat. No. 4,209,853 issued on June 24, 1980;
16. COMPUTERIZED MACHINE CONTROL SYSTEM Ser. No. 476,743 filed on June 5, 1974;
17. SIGNAL PROCESSING AND MEMORY ARRANGEMENT Ser. No. 522,559 filed on Nov. 11, 1974; now U.S. Pat. No. 4,209,852 issued on June 24, 1980.
18. METHOD AND APPARATUS FOR SIGNAL ENHANCEMENT WITH IMPROVED DIGITAL FILTERING Ser. No. 550,231 filed on Feb. 14, 1975 now U.S. Pat. No. 4,209,843 issued on June 24, 1980;
19. ILLUMINATION SIGNAL PROCESSING SYSTEM Ser. No. 727,330 filed on Sept. 27, 1976 now abandoned in favor of continuation;
20. PROJECTION TELEVISION SYSTEM USING LIQUID CRYSTAL DEVICES Ser. No. 730,756 filed on Oct. 7, 1976;
21. INCREMENTAL DIGITAL FILTER Ser. No. 754,660 filed on Dec. 27, 1976;
22. ANALOG READ ONLY MEMORY Ser. No. 812,285 filed on July 1, 1977;
23. MEMORY ARCHITECTURE Ser. No. 844,765 filed on Oct. 25, 1977;
24. INTELLIGENT DISPLAY SYSTEM Ser. No. 849,733 filed on Nov. 9, 1977;
25. DIGITAL SOUND SYSTEM FOR CONSUMER PRODUCTS Ser. No. 849,812 filed on Nov. 9, 1977; and
26. HIGH INTENSITY ILLUMINATION CONTROL SYSTEM Ser. No. 860,277 filed on Dec. 13, 1977.

all by Gilbert P. Hyatt:

wherein the benefit of the filing dates of this chain of copending applications is herein claimed under 35 USC 120, 35 USC 121, and other authorities provided therefor: and wherein the instant application is further related to applications:

27. INTERACTIVE CONTROL SYSTEM Ser. No. 101,449 filed on Dec. 28, 1970 by Lee, Cole, Hirsch, Hyatt, and Wimmer now abandoned in favor of a continuing application;
28. ADAPTIVE ILLUMINATION SOURCE INTENSITY CONTROL DEVICE Ser. No. 152,105 filed on June 11, 1971 by Lee, Wimmer, and Hyatt now U.S. Pat. No. 3,738,242 issued on June 12, 1973;
29. ADAPTIVE ILLUMINATION CONTROL DEVICE Ser. No. 325,792 filed on Jan. 22, 1973 by Lee, Wimmer, and Hyatt now U.S. Pat. No. 3,927,411 issued on Dec. 16, 1975;
30. ILLUMINATION CONTROL SYSTEM Ser. No. 327,918 filed on Jan. 30, 1973 by Lee, Wimmer, and Hyatt now U.S. Pat. No. 3,818,496 issued on June 18, 1974;
31. INTERACTIVE CONTROL SYSTEM Ser. No. 354,590 filed on Apr. 24, 1973 by Lee, Cole, Hirsch, Hyatt, and Wimmer now U.S. Pat. No. 4,038,640 issued on July 26, 1977;
32. MEANS AND METHOD FOR SELECTIVELY CONTROLLING ANIMALS Ser. No. 438,328 filed on Jan. b 31, 1974 by Lee and Hyatt now U.S. Pat. No. 3,897,753 issued on Aug. 5, 1975;
33. ADAPTIVE ILLUMINATION CONTROL DEVICE Ser. No. 495,349 filed on Aug. 7, 1974 by Lee, Wimmer, and Hyatt;
34. ELECTRONIC LOCK AND KEY SYSTEM Ser. No. 583,136 filed on June 2, 1975 by Lee and Hyatt now U.S. Pat. No. 4,036,178 issued on July 19, 1977; and
35. ELECTRO-OPTICAL PRINTER Ser. No. 754,647 filed on Dec. 27, 1976 by Stanly and Hyatt now U.S. Pat. No. 4,236,223 issued on Nov. 25, 1980:

wherein all of the above-mentioned applications are herein incorporated-by-reference as if fully set forth at length herein.

The instant application is further related to applications

36. PULSEWIDTH MODULATED FEEDBACK ARRANGEMENT FOR ILLUMINATION CONTROL Ser. No. 874,446 filed on Feb. 2, 1978 by Gilbert P. Hyatt and now issuing as a U.S. patent;

37. ELECTRO-OPTICAL ILLUMINATION CONTROL SYSTEM Ser. No. 169,257 filed on July 16, 1980 by Gilbert P. Hyatt and now issuing as a U.S. patent;

38. ILLUMINATION SIGNAL PROCESSING SYSTEM Ser. No. 874,444 filed on Feb 2, 1978 by Gilbert P. Hyatt; and 39. ILLUMINATION SIGNAL PROCESSING SYSTEM Ser. No. 874,445 filed on Feb. 2, 1978 by Gilbert P. Hyatt.

TABLE OF CONTENTS

Section

Abstract of the Disclosure
Cross Reference to Related Applications
Background of the Invention
  Field of the Invention
  Description of the Prior Art
Summary of the Invention
Brief Descriptions of the Drawings
Detailed Description of the Invention
  Illumination Amplifier Devices
  Digital Excitation
  Analog Excitation
  Schematic Notation
  Illumination Computer
  Digital Control Arrangements
  Analog Control Arrangements
  Batch Fabricated Arrangement
  Closed Loop Control
  Flat Plane Configuration
  Discrete Illumination Device
  Light Pen Arrangement
  Illuminated Switches
  Color Control
  Control of Natural Illumination
  Illumination Control for Buildings
  Illumination Control for Vehicles
  Illumination Shade
  Temperature Control
  Control of Artificial Illumination
  Lamp Control
  Dimmer Control
  Flasher Control
  Camera Systems
  Image Rotation Control
  Aperture Control
  Shutter Control
  Photographic Camera System
  Source Illumination Control
  Audience Display System
  Illumination Chopper, Scanner, And Modulator
  Illumination Modulators
  Camera System Improvements
  Movie Camera System
  Computer Control Arrangement
  Traffic Light Control
  Operator Panel
  Improved Slide Projector
  Segment Arrays
  Multiple Electrode Logic
  Fringe Control
  Integrated Electro-Optic Devices
  Improved Fiber Optic Arrangement
  Additional Considerations
  Pertinence Of Material Incorporated-By-Reference
  Projection Display Arrangement
  Alternate Scanner Embodiment
  Spacial Control Of Illumination
  Audience Display System, Additional Features
  Further Considerations
  Electro-Optical Thermal Design
  Large Panel Construction
  Antecedent Basis For Projection Disclosure
  Pulse Modulated Control
  Time-Domain Pulse Modulation
  Optical Effects
  Light Organ
  Further Spacial Control Features
SCOPE AND LIMITATIONS
IN THE CLAIMS

BACKGROUND OF THE INVENTION

1. Field of the Invention

This invention relates to illumination control systems and, in particular, solid state illumination control systems using illumination amplifiers.

2. Description of the Prior Art

Control of illumination has been accomplished in the prior art with mechanical devices. The well known aperture and shutter of a camera are common mechanical devices for controlling light. Other prior art illumination control arrangements are described hereafter.

In the photoplotter field, a photohead is used to control light for exposing film. Mechanically positioned filters and shutters are used for illumination control such as described in U.S. Pat. No. 3,330,182 issued in July 1967.

In the construction field; mechanical devices such as shutters, louvres, shades, and awnings are used to control natural illumination. These devices may be fixed or mechanically controlled, but are not provided with electronic control capability.

In the computer field, electronic computers are in wide scale use. Illumination signals must be converted to electronic form for processing in prior art systems because of the absence of illumination computer devices for processing illumination signals.

In the display field, liquid crystal displays require external light, either dependent on ambient light or using light bulbs. Integral illumination sources have not been available for such displays.

Liquid crystal displays provide only fully on or fully off conditions, but do not provide analog or proportional control. Limitations of on-off control arrangements have severly limited applicability of liquid crystal devices. Also, because servo control is related to proportional control, servo control of illumination has not been feasible.

The prior art and subsequent art in illumination control is furter defined in the art-of-record of the parent application Ser. No. 366,714 including U.S. Pat. Nos. 3,790,901 to White et al; 3,778,791 to Lewicki et al; 3,764,213 to O'Meara; 3,744,906 to Sato et al; 3,720,923 to Chen et al; 3,713,042 to Kinsel; 3,705,758 to Haskal; 3,696,344 to Feinleib et al; 3,670,202 to Paine et al; 3,558,892 to Seeley; 3,473,084 to Dodge; and 3,427,458 to Parfomak et al and in the art-of-record of the parent application Ser. No. 730,756 including U.S. Pat. Nos. 3,981,002 to Gardner; 3,798,452 to Spitz et al; 3,786,486 to Torresi; 3,707,323 to Kessler et al; 3,702,723 to Borden Jr.; 3,700,805 to Hanlon; 3,666,881 to Stein; 3,647,959 to Schlesinger et al; 3,641,264 to Macovski; 3,627,408 to Fergason; 3,605,594 to Gerritsen; 3,576,364 to Zanoni; 3,566,021 to Jakes Jr.; 3,544,711 to De Bitetto; 3,541,254 to Orthuber; 3,527,879 to Pritchard; 3,444,316 to Gerritsen; 3,231,746 to Goodrich; and 2,169,838 to Herbst which are herein incorporated-by-reference. The prior art in illumination control is still further defined in the art-of-record of the reference related applications including U.S. Pat. Nos. 3,836,916 to Wiley; 3,721,164 to Kuttigen; 3,703,858 to Canfora; 3,695,154 to Webster; 3,686,675 to Faul; 3,648,578 to Ritchie; 3,610,119 to Gerber; 3,595,147 to Blattner; 3,565,524 to Pabst et al; 3,498,711 to Ables et al; 3,458,253 to Hansen; 3,354,806 to DeLang et al; 3,330,182 to Gerber et al; 3,323,414 to Ritchie et al; and 3,048,093 to Loro.

SUMMARY OF THE INVENTION

The present invention provides an illumination control system for improved control of illumination. This illumination control system uses substantially all solid state devices for electronic control of illumination, with reduced dependence on mechanical control devices.

Illumination amplifiers are provided which control the transmissivity-reflectivity characteristic as a function of applied excitation. Such amplifier devices may be controlled in a digital fashion or in an analog fashion using electronic signals for control of illumination. Also, servo arrangements are provided for precise control of illumination.

Availability of a basic illumination processing component, the illumination amplifier, permits a wide variety of illumination processing systems to be implemented. These systems include illumination computers of both the digital and the analog variety, photographic cameras, photoplotter systems, illumination controls for vehicles such as automobiles, light and heat control systems for inhabited structures, and other such illumination systems.

Various control configurations may be provided including open and closed loop controls, analog and digital controls, illumination amplifier excitation arrangements, and other control configurations.

An object of this invention is to provide an improved illumination control system.

A further object of this invention is to provide a solid state illumination control system.

A still further object of this invention is to provide an illumination control system for an inhabited structure.

Yet a further object of this invention is to provide illumination computer arrangements including both analog and digital illumination arrangements.

Another object of this invention is to provide improved excitation and control devices for illumination amplifier arrangements.

Yet another object of this invention is to provide illumination closed loop servos for precision control Still a further object of this invention is to provide an improved display arrangement.

Yet another object of this invention is to provide an improved illuminated switch arrangement.

Yet still another object of this invention is to provide improved chopper, scanner and modulator arrangements.

Still another object of this invention is to provide improved photographic control arrangements.

Still another object of the present invention is to provide an improved projection display arrangement.

Still another object of the present invention is to provide an improved heat transfer arrangement.

Still another object of the present invention is to provide an improved large panel arrangement.

The foregoing and other objects, features, and advantages of this invention will become apparent from the following detailed description of preferred embodiments of this invention, as illustrated in the accompanying drawings.

BRIEF DESCRIPTIONS OF THE DRAWINGS

A better understanding of the invention may be had from a consideration of the following detailed description taken in conjunction with the following drawings, in which.

FIG. 3 illustrates illumination arrangements in schematic and block diagram form comprising FIG. 3A showing a generalized control network, FIG. 3B showing operation of a single illumination amplifier, FIG. 3C showing an exclusive-OR and coincidence logical arrangement, FIG. 3D showing a flip-flop logical arrangement, FIG. 3E showing an analog exponential arrangement, and FIG. 3F showing an analog implicite servo arrangement.

Figure 4:
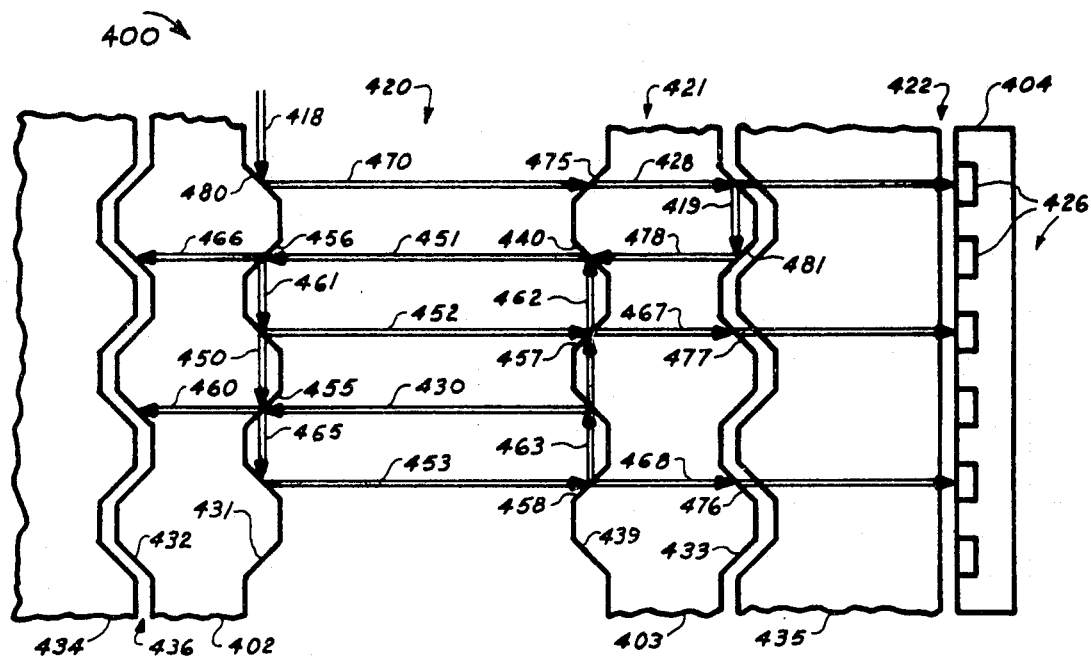

FIG. 4 is a schematic diagram of a batch fabricated illumination control arrangement.

Figure 5:
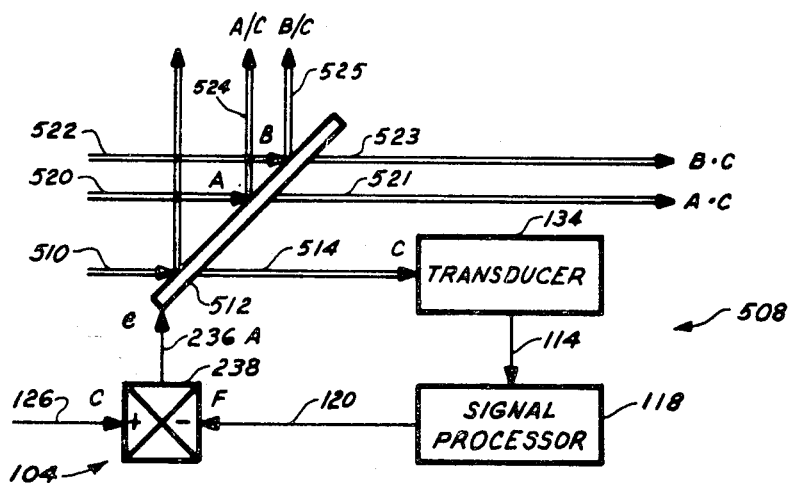

FIG. 5 is a schematic and block diagram illustrating a closed loop control for an illumination amplifier arrangement.

Figure 6E:
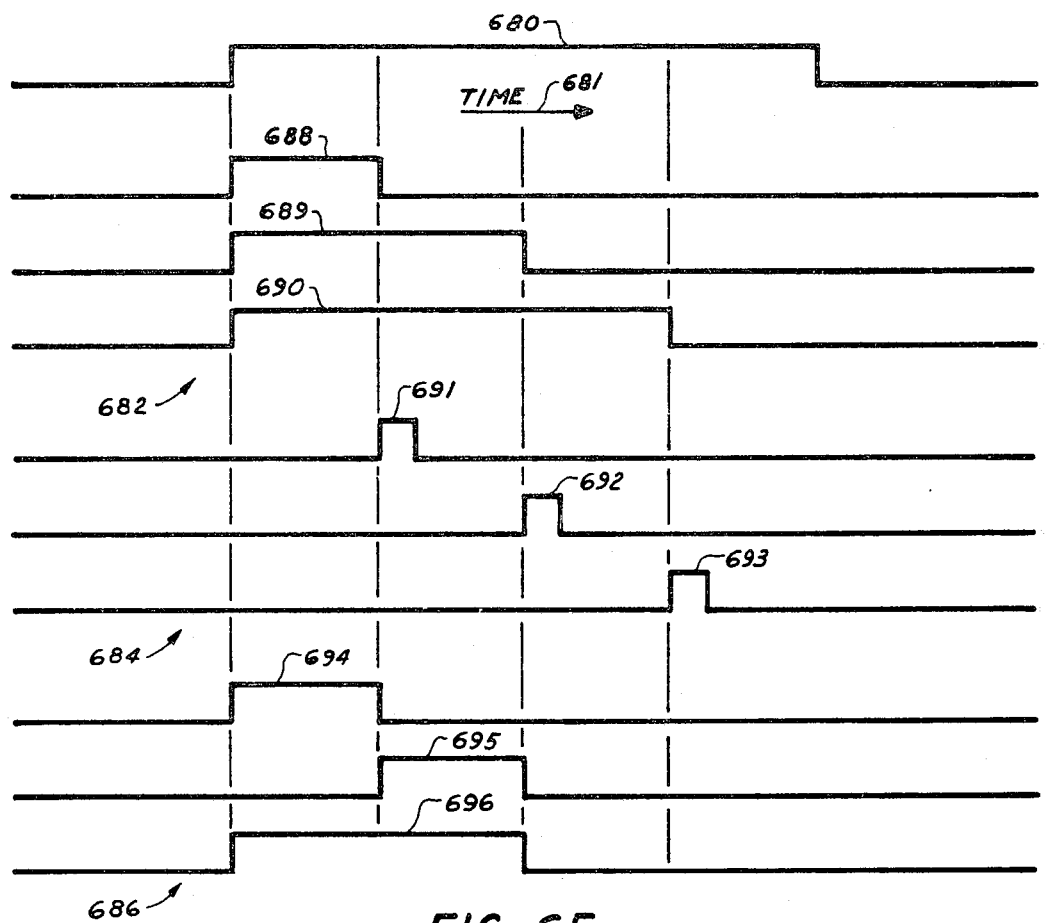

FIG. 6 illustrates display arrangements in schematic, waveform, and block diagram form comprising FIG. 6A showing a batch fabricated display arrangement, FIG. 6B showing a batch fabricated illuminated switch arrangement, FIG. 6C showing an illuminated switch schematic diagram, FIG. 6D showing a control arrangement for colored illumination, and FIG. 6E showing pulse modulation control waveforms.

Figure 7A:
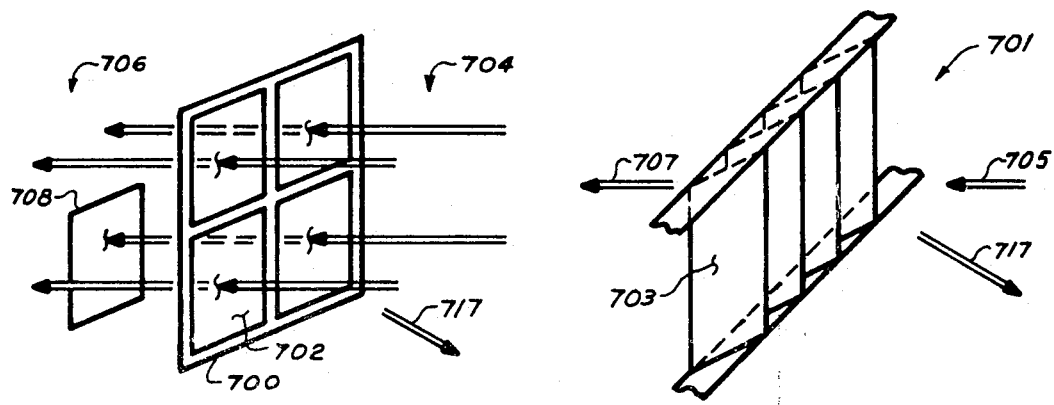
Figure 7B:
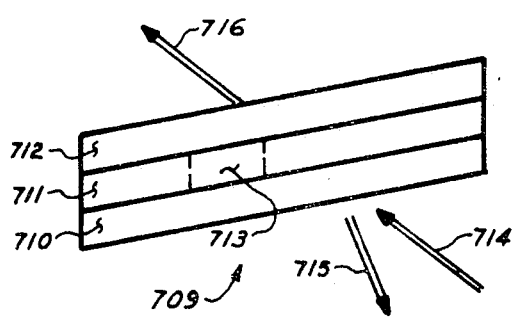
Figure 7C:
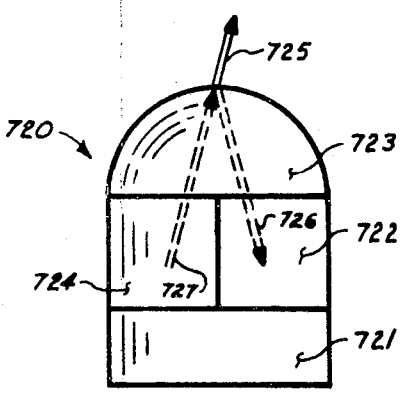
Figure 7D:
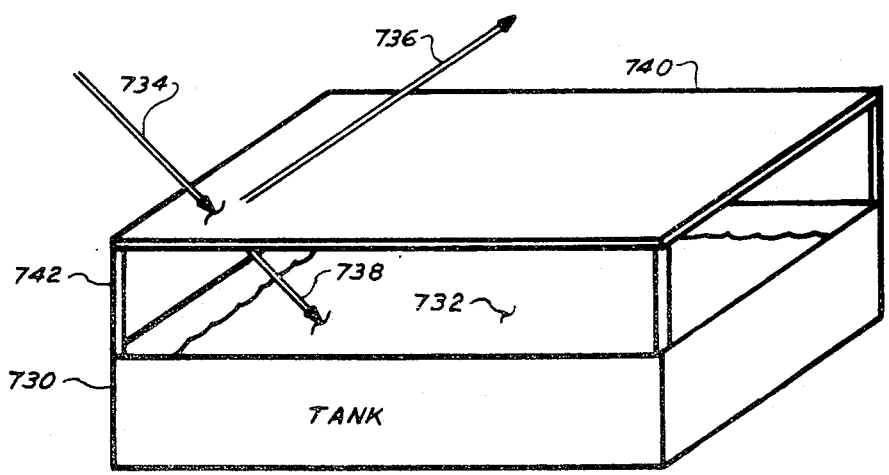

FIG. 7 is a schematic and block diagram illustrating illumination control arrangements for buildings and for vehicles comprising FIG. 7A showing a first window and a louver illumination control arrangement, FIG. 7B showing a second window illumination control arrangement, FIG. 7C showing an artificial illumination control arrangement, and FIG. 7D showing a temperature control arrangement.

Figure 8A:
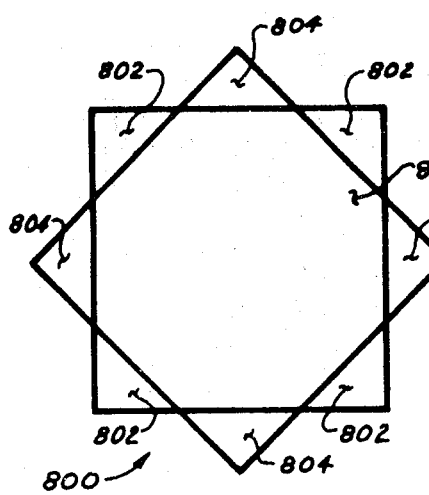
Figure 8B:
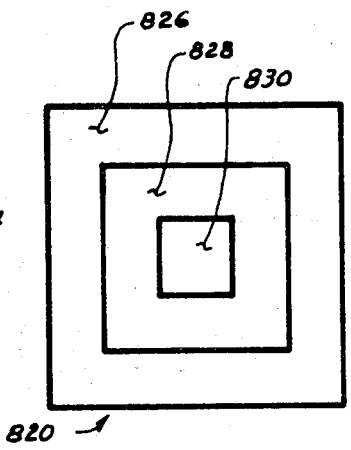
Figure 8C:
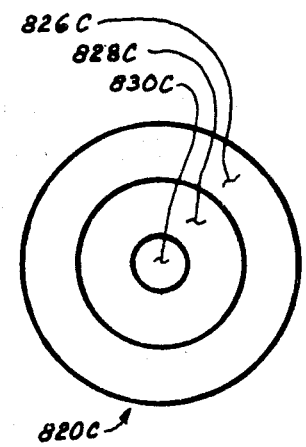
Figure 8D:
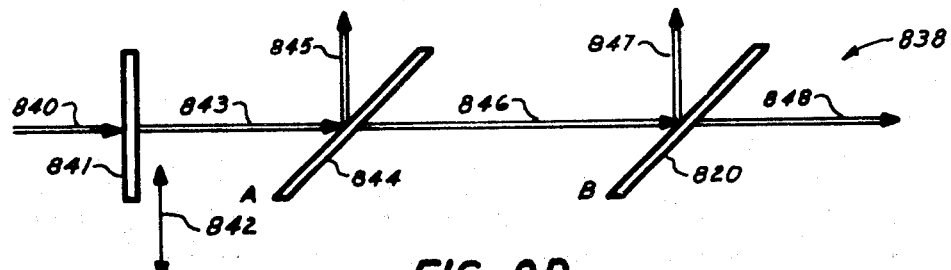

FIG. 8 is a schematic and block diagram illustrating illumination control arrangements for camera systems comprising FIG. 8A showing an image rotation arrangement, FIG. 8B showing a square aperture arrangement, FIG. 8C showing a circular aperture arrangement, and FIG. 8D showing an illumination control arrangement for a camera.

Figure 9A:
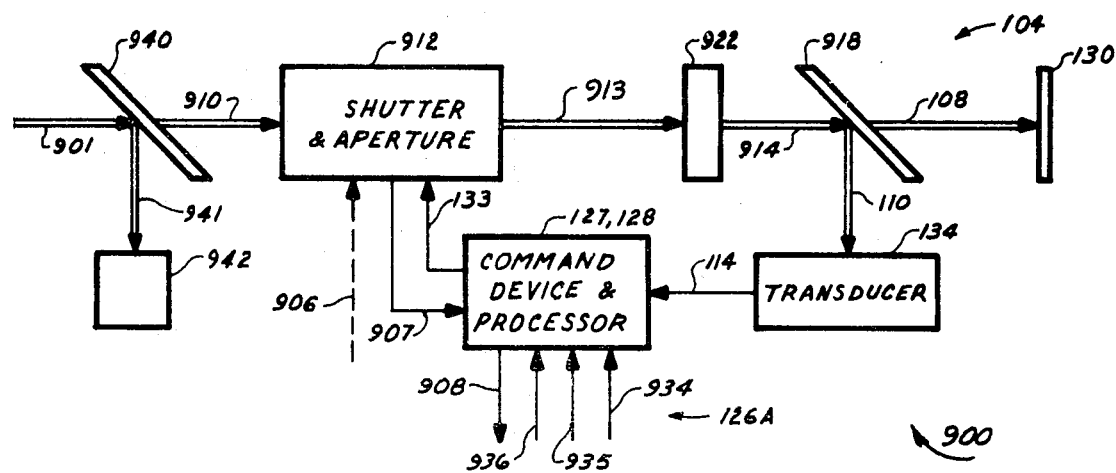
Figure 9B:
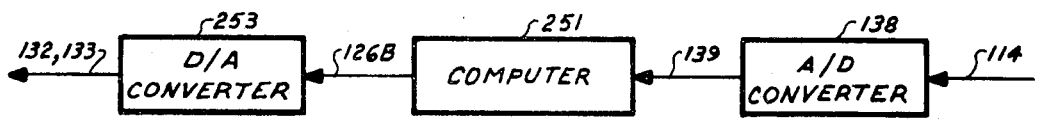
Figure 9C:
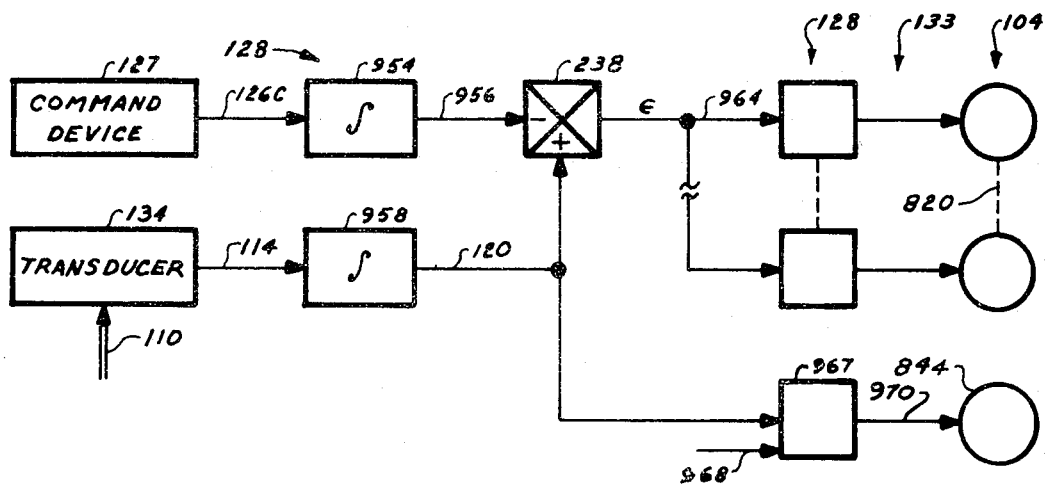

FIG. 9 is a schematic and block diagram illustrating a camera control system in accordance with the present invention comprising FIG. 9A showing a detailed camera control arrangement, FIG. 9B showing a computer control arrangement, and FIG. 9C showing a special purpose control arrangement.

Figure 10:
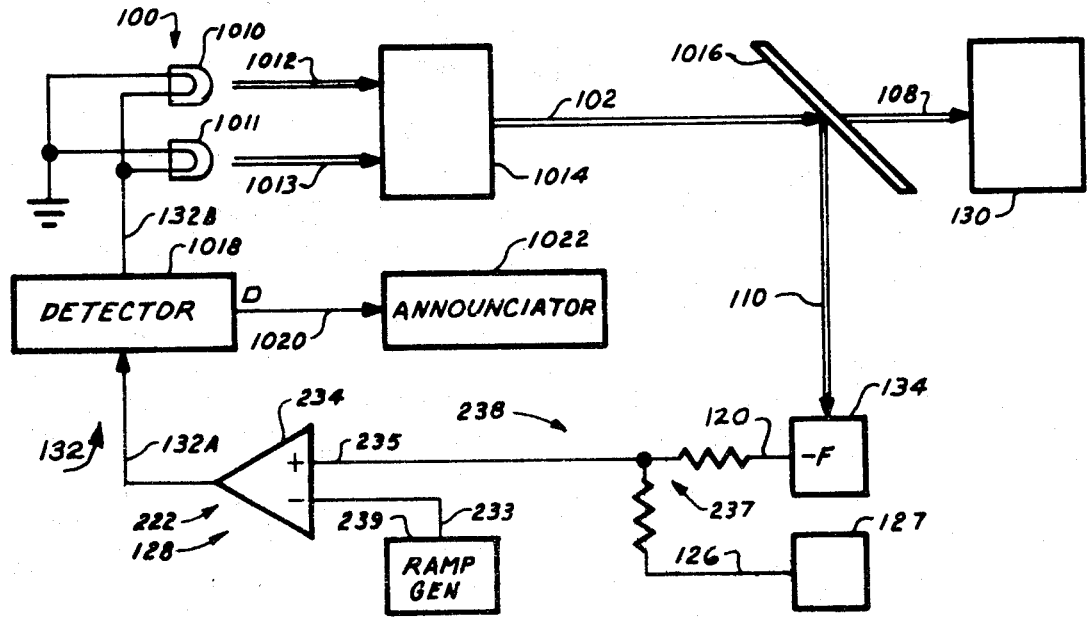

FIG. 10 is a schematic and block diagram illustrating a photoplotter system in accordance with the present invention.

Figure 11:
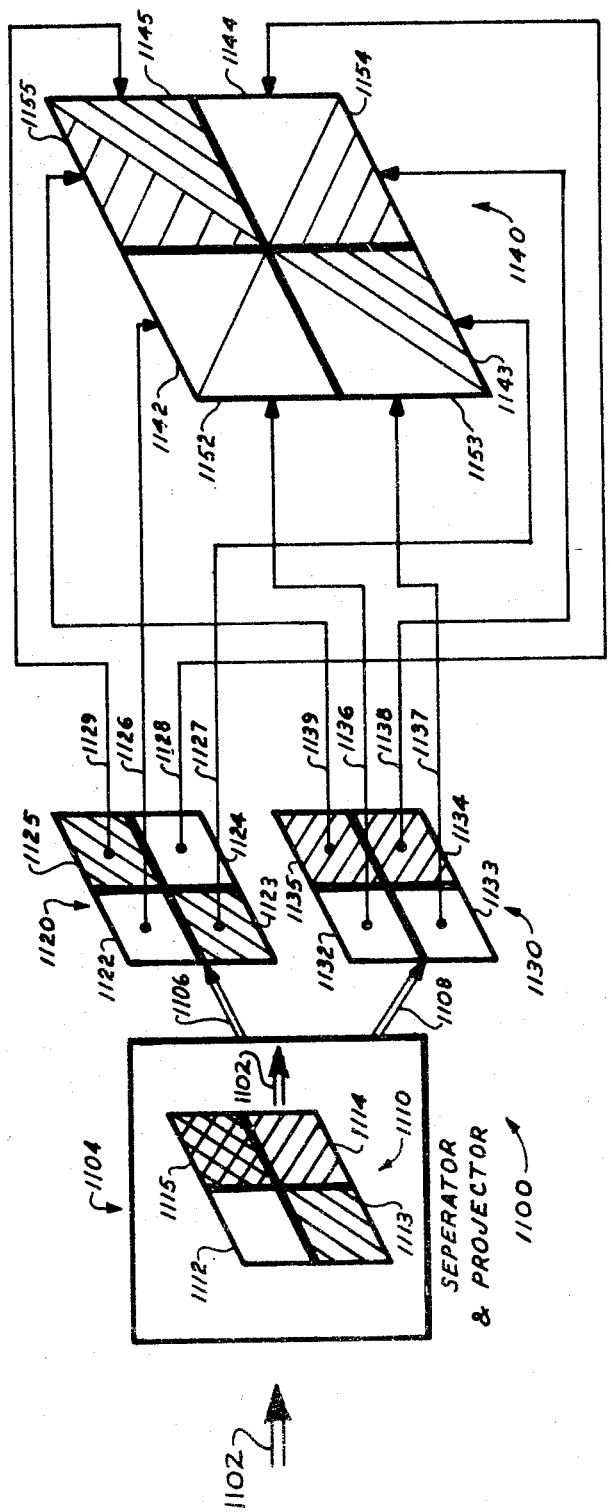

FIG. 11 is a schematic and block diagram illustrating a display system in accordance with the present invention.

Figure 12A:
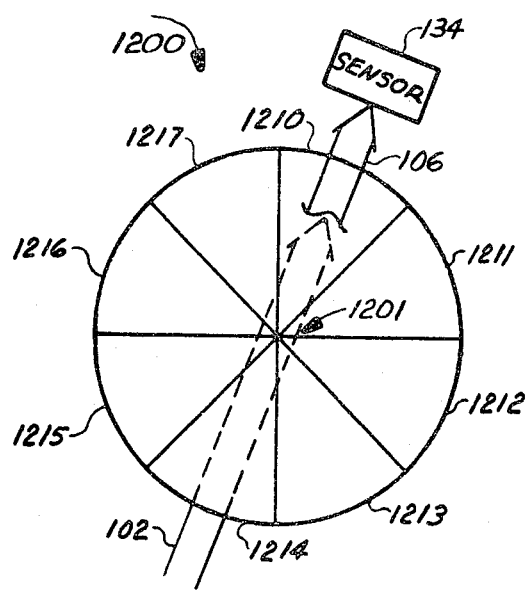
Figure 12B:
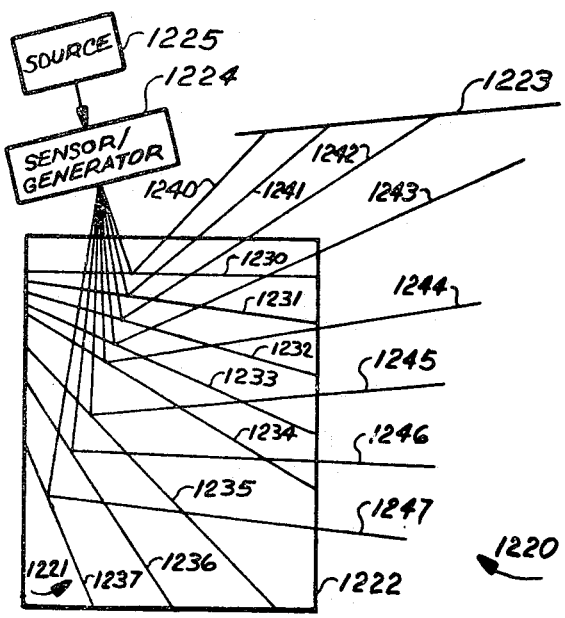
Figure 12C:
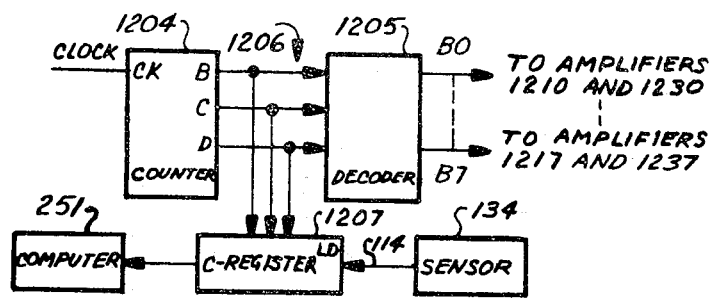
Figure 12D:
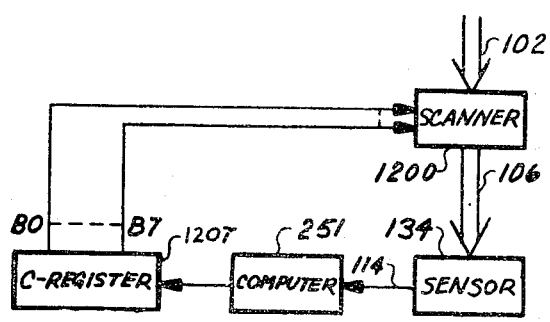
Figure 12E:
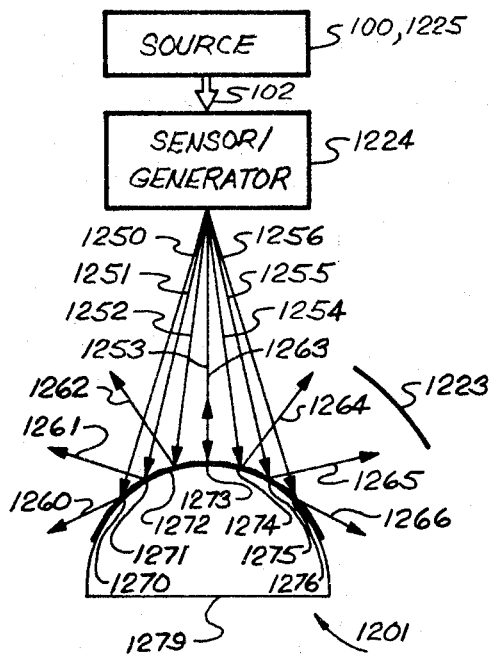

FIG. 12 is a schematic and block diagram illustrating an illumination scanner, chopper, and modulator system in accordance with the present invention comprising FIG. 12A showing a first electro-optical embodiment, FIG. 12B showing a second electro-optical embodiment, FIG. 12C showing a first control embodiment, FIG. 12D showing a second control embodiment, and FIG. 12E showing a third electro-optical embodiment.

Figure 13:
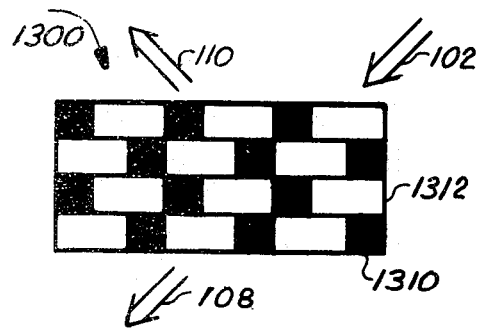

FIG. 13 is a schematic and block diagram illustrating an interspersed array of electro-optical elements for illumination control.

Figure 14A:
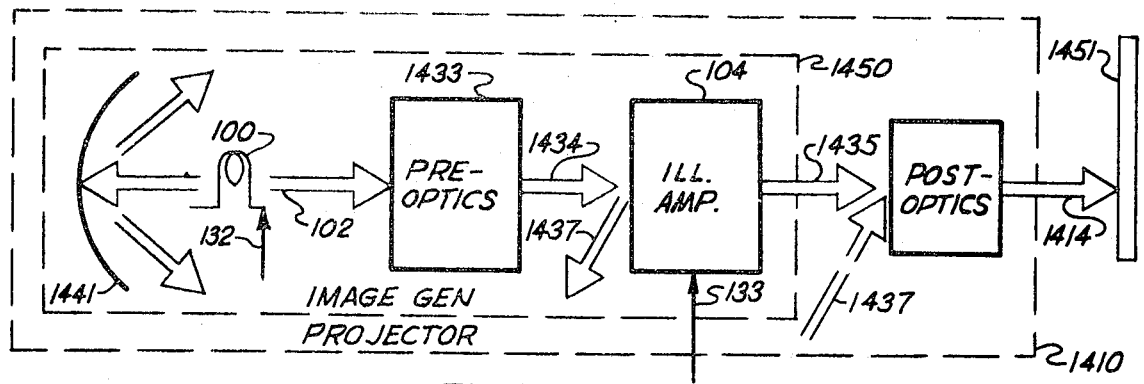
Figure 14B:
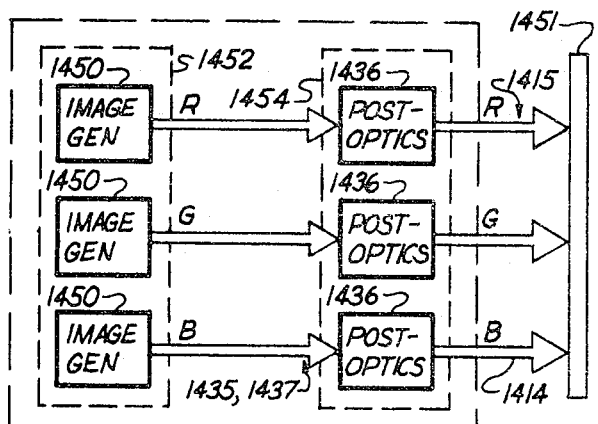
Figure 14D:
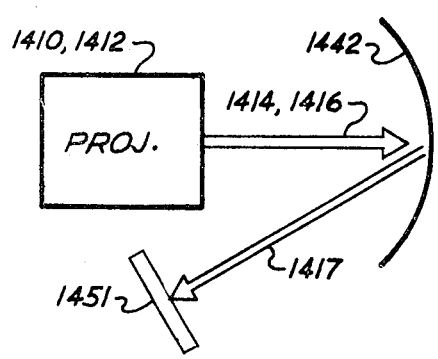
Figure 14C:
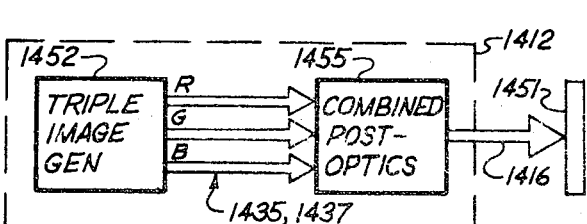
Figure 14E:
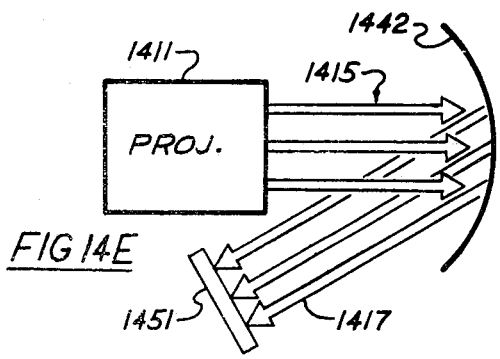
Figure 14F:
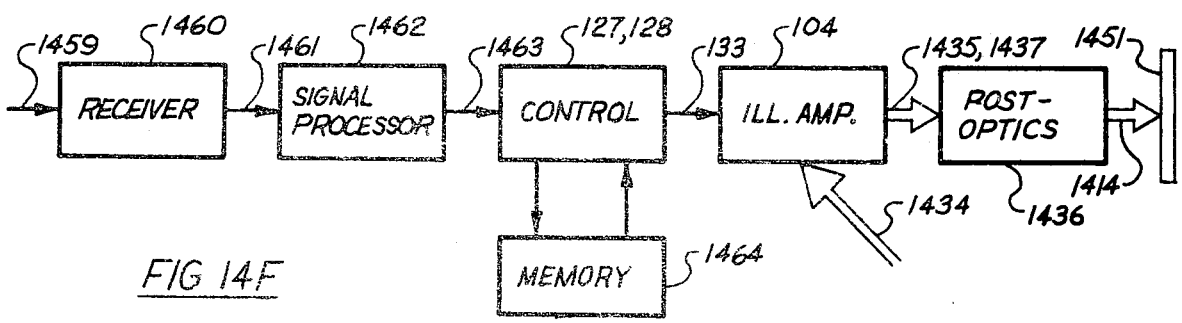

FIG. 14 is a schematic and block diagram illustrating a projection display arrangement comprising FIG. 14A showing a single projector arrangement, FIGS. 14B through 14E showing multiple image projection arrangements, and FIG. 14F showing a TV projection embodiment.

Figure 15A:
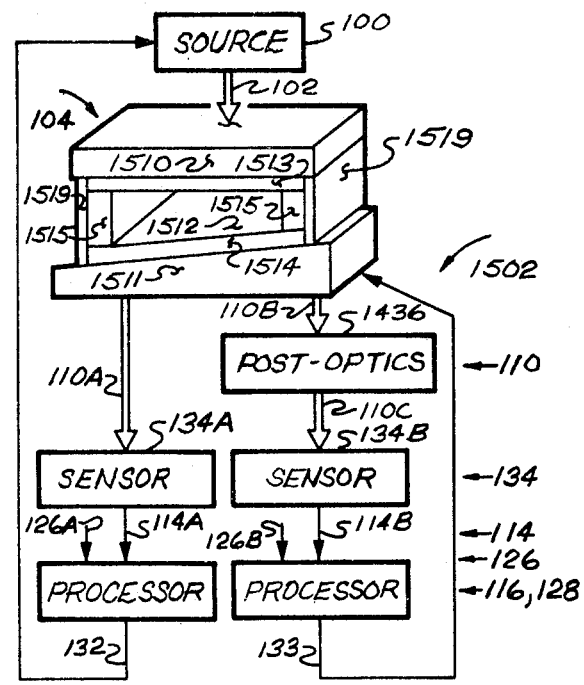
Figure 15C:
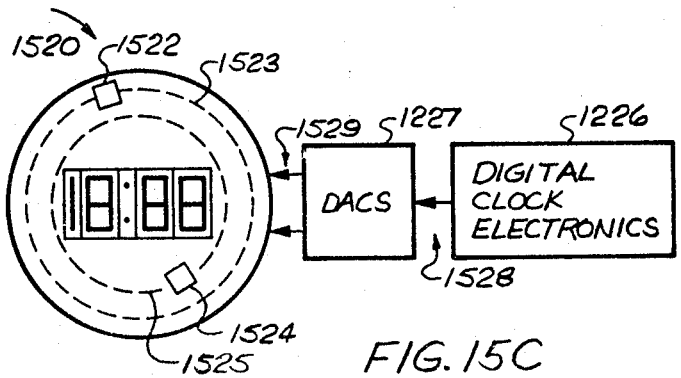
Figure 15B:
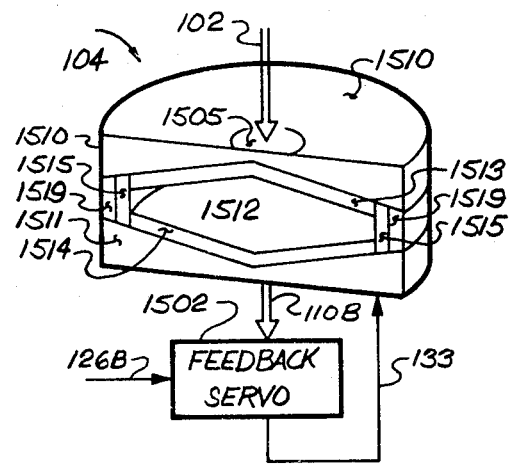
Figure 15D:
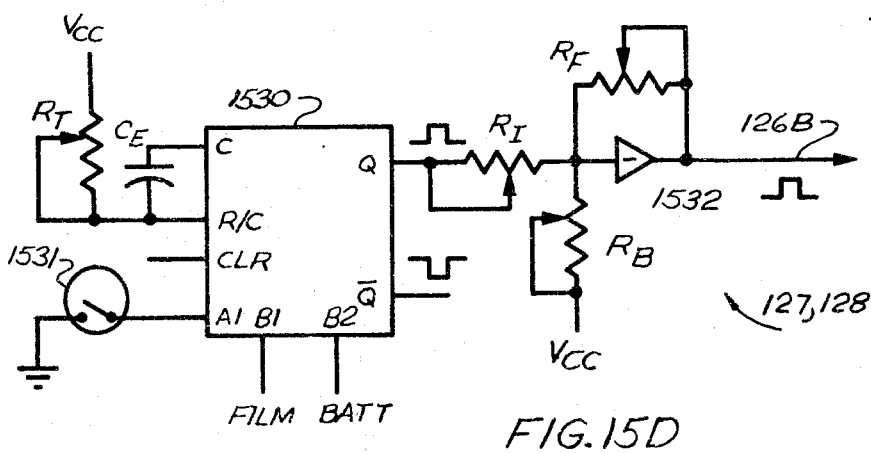

FIG. 15 is a schematic and block diagram illustrating spacial control comprising FIG. 15A showing a rectangular symetry arrangement, FIG. 15B showing a circular symetry arrangement, FIG. 15C showing a watch embodiment, and FIG. 15D showing a camera control embodiment.

FIG. 16 is a structural arrangement illustrating alternate embodiments of a projection illumination amplifier arrangement, heat transfer arrangement, and large panel arrangement comprising FIG. 16A showing a general heat transfer arrangement, FIG. 16B showing a picture frame heat transfer arrangement, FIG. 16C showing an edge heat transfer arrangement, FIG. 16D showing a reflective mode back-mounted heat transfer arrangement, FIG. 16E showing heat transfer devices, FIG. 16F showing a projection display system employing various heat transfer arrangements, and FIG. 16G showing various heat transfer and large panel construction features in accordance with the present invention.

FIG. 17 is a block and schematic diagram arrangement showing pulse modulated and display arrangements comprising FIG. 17A showing a pulse modulation circuit, FIG. 17B showing a pulse modulation program flow diagram, FIGS. 17C and 17D showing a liquid crystal display arrangement, and FIG. 17E showing a liquid crystal toy.

Material pertinent to the figures has been cancelled and incorporated by reference from U.S. Pat. No. 3,986,022 and from applications Ser. Nos. 730,756 and 860,277; all referenced herein.

By way of introduction of the illustrated embodiment, the components shown in FIGS. 1 through 17 of the drawings have been assigned general reference numerals and a brief description of such components is given in the following description. The components in FIGS. 1–16 have in general been assigned three or four digit reference numerals wherein the hundreds digit of the reference numerals corresponds to that figure number. For example, the components in FIG. 1 have reference numerals between 100 and 199 and the components in FIG. 2 have reference numerals between 200 and 299 except that the same component appearing in successive drawing figures has maintained the first reference numeral. The components in FIG. 17 has not been numbered as discussed above, but has been assigned 900 series reference numerals to be consistent with the corresponding figure in the referenced copending applications.

DETAILED DESCRIPTION OF THE INVENTION

The illumination control system of this invention can take any of a number of possible forms. Preferred embodiments of several features of the present invention are shown in the accompanying figures and will be described in detail hereafter.

Figure 1:
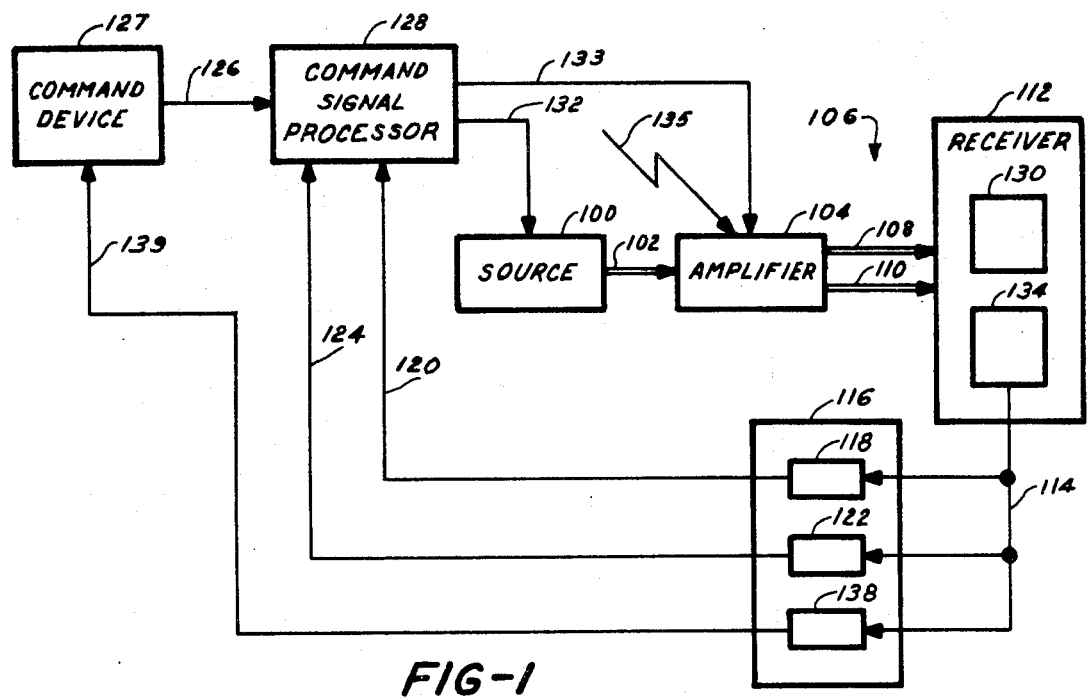
FIG. 1 is a block diagram of an illumination control arrangement in accordance with the present invention.

The system of this invention is exemplified by the simplified block diagram shown in FIG. 1. An illumination source 100 generates illumination 102 which is directed to an illumination amplifier 104. The illumination 102 from the source 100 may be defined as source illumination. Source illumination 102 may be raw illumination or may be controlled by source illumination control devices such as will be described hereafter. Illumination amplifier 104 may be a variable illumination transmissivity device such as a well known liquid crystal device. Controlled illumination 106 from illumination amplifier 104 is directed to illumination receiver 112. This controlled illumination 106 may be controlled by reflection, transmission, or by other characteristics of illumination amplifier 104. Also, controlled illumination 106 may comprise a plurality of illumination signals such as one or more reflected components and one or more transmitted components, where one of these illumination components 108 may perform a first illumination task such as exposing an illumination sensitive medium which may be receiver 130 and another of these illumination components 110 may perform a second illumination task such as illuminating an illumination sensitive feedback transducer which may be receiver 134. The illumination sensitive medium provides an illumination reaction in response to the illumination such as a chemical reaction in a photographic film medium or a thermal reaction in an illumination absorbing medium, wherein exposure of such mediums are discussed in detail hereinafter. One arrangement comprising control of a plurality of illumination signals will be discussed hereafter with reference to FIGS. 3, 4, and 5.

Illumination receiver 112 may include an arrangement for illuminating an illumination sensitive medium 130 such as a film and may include a feedback transducer 134 for providing feedback signal 114 for control of illumination.

Illumination feedback signals 114 may be used to control illumination amplifiers 104, may be used to control illumination sources 100 and may be used as feedback to command devices 127. Feedback signal processor 116 provides signal processing for feedback signals 114 and may include illumination amplifier feedback signal processor 118 for generating an illumination amplifier feedback signal 120 for control of illumination 106 by amplifiers 104 with processed command signals 133; may furher include illumination source feedback signal processor 122 for generating illumination source feedback signals 124 for control of illumination 102 by source 100 with processed command signals 132; and may still further include illumination command device feedback signal processor 138 for generating illumination command device feedback signals 139 for control of command signals 126 by command devices 127.

Illumination command signal 126 may be open loop or closed loop input commands from command devices 127. Such a command device may be a manual device for operator control such as a switch arrangement or may be an automatic device such as a digital computer, an analog computer, or other such well known command arrangements. Command signal processor 128 may generate illumination source command signals 132 to command source 100 to generate source illumination 102; or may generate illumination amplifier command signals 133 to command amplifier 104 to control illumination 106; or both.

DISCLOSURE FROM APPLICATION Ser. No. 366,714

Discussions on Illumination Amplifier Devices, Digital Excitation, Analog Excitation, Schematic Notation, Illumination Computer, Digital Control Arrangements, Analog Control Arrangements, Batch Fabricated Arrangement, Closed Loop Control, Flat Plane Configuration, Discrete Illumination Device, Light Pen Arrangement, Illumination Switches, Color Control, Control Of Natural Illumination, Illumination Control For Buildings, Illumination Control For Vehicles, Illumination Shade, Temperature Control, Control Of Artificial Illumination, Lamp Control, Dimmer Control, Flasher Control, Camera Systems, Image Rotation Control, Aperture Control, Shutter Control, Photographic Camera System, Source Illumination Control; and Audience Display System are provided in referenced application Ser. No. 366,714 at page 10 line 1 to page 109 line 32 therein; which is now U.S. Pat. No. 3,986,022 at column 5 line 16 to column 55 line 27 therein; and which is herein incorporated by reference. Discussions on projection illumination amplifier arrangements, lens and illumination amplifier combinations, and illumination amplifier coherent illumination are provided in referenced application Ser. No. 366,714 at FIGS. 6D and 8-10, page 26 lines 19-32, page 61 lines 13-18, page 62 lines 7-9, page 84 line 1 to page 96 line 22, page 112 lines 30-34, page 113 lines 9-25, and elsewhere therein; which is now U.S. Pat. No. 3,986,022 at FIGS. 6D and 8-10, column 13 lines 33-49, column 31 lines 1-7, column 31 lines 31-33, column 41 line 46 to column 48 line 37, column 57 lines 4-9, column 57 lines 19-37, and elsewhere therein respectively; and which is herein incorporated by reference.

ILLUMINATION CHOPPER, SCANNER, AND MODULATOR

The illumination amplifier feature of the present invention provides an improved means and method for chopping, scanning, and modulating illumination. Prior art devices typically involve rotating mirrors or CRT flying spot scanners, as discussed in the articles (1) Optical Scanner; Comparisons and Applications by Compton published in the February 1976 issue of Electo-Optical Systems Design and (2) Laser/Galvo Scanner Design by Tenney et al published in the October 1975 issue of Electro-Optical Systems Design magazine at pages 40-45 and herein incorporated-by-reference. The illumination amplifier feature of the present invention can provide further advantages in combination with prior art devices. For example, the reflective surfaces used in many prior art electro-mechanical scanners can be replaced by the illumination amplifier arrangement of the present invention to provide electro-optical control in place of or in addition to prior art electro-mechanical control. Still further advantages may be achieved with a fully solid-state illumination control scanner, chopper, or modulator device as discussed below with reference to FIGS. 12A-12C.

An illumination amplifier device is shown in FIG. 12A thay may be used as an optical scanner, chopper, or modulator. Illumination amplifier segments 1210-1217 may be individually controlled such as to be either reflective or transmissive in response to electrical control signals. Illumination signal 102, shown incident upon scanner 1200, is transmitted by segments controlled to be transmissive such as with illumination 102 transmitted through segment 1210 to illuminate sensor 134.

Illumination 102 may be chopped by selectively controlling segments 1210-1217 to be sequentially or randomly transmissive and reflective. A sequential rotary scan will now be described for simplicity although other non-sequential scans may be provided. In the rotary scan, one and only one segment is controlled to be transmissive, wherein each of the segments is sequentially controlled to be transmissive. For example, segment 1210 may be tansmissive and segments 1211-1217 may be controlled to be reflective, then segment 1211 may be controlled to be transmissive and segments 1210 and 1212-1217 may be controlled to be reflective, then segment 1212 may be controlled to be transmissive and segments 1210-1211 and 1213-1217 may be controlled to be reflective etc as shown in the table listing Sequential States. This table lists the repetitive sequence of scanner states and the transmissive and reflective segments for each state.

| SEQUENTIAL STATES | | | |
|---|---|---|---|
| SEQUENCE | CONTROL SIGNAL | TRANSMISSIVE SEGMENTS | REFLECTIVE SEGMENTS |
| 0 | B0 | 1210 | 1211-1217 |
| 1 | B1 | 1211 | 1210, 1212-1217 |
| 2 | B2 | 1212 | 1210-1211, 1213-1217 |
| 3 | B3 | 1213 | 1210-1212, 1214-1217 |
| 4 | B4 | 1214 | 1210-1213, 1215-1217 |
| 5 | B5 | 1215 | 1210-1214, 1216-1217 |
| 6 | B6 | 1216 | 1210-1215, 1217 |
| 7 | B7 | 1217 | 1210-1216 |
| 0 | B0 | 1210 | 1211-1217 |

After a complete scan with all segments, the scan may continue sequentially from segment 1217 to segment 1210 and repeat the sequence. This rotating scan concept is analogous to the well-known mechanical rotating chopper used on astrotrackers such as the Kollsman KS-50 astrotracker and other angular positioning devices.

A solid-state scanner will now be described with reference to FIG. 12B using illumination amplifier devices. In the prior art, scanner arrangements use oscillating or movable mirror arrangements such as used in the Zerox electrostatic copier machine, where a mirror is rotated or oscillated to scan a document for printing purposes. Other mechanical scanner arrangements are well known in the art. Problems exist with such prior scanners, where electro-mechanical scanners traverse a fixed scan cycle due to inertial characteristics and where the optical output may be "smeared" due to the continuous motion of the mechanical scanner. A solid-state electro-optical scanner in accordance with the present invention provides discretely selectable conditions selectable under electronic control independent of inertia and other such sequential characteristics thereby permitting random scan arrangements and virtually any scan sequence. Further, the scanner arrangement in accordance with the present invention permits discrete scan position to be selected and maintained, thereby providing a continuously changing image to the illumination destination and minimizing the blur or smearing effect of a continuous scan. The scanner of the present invention will be exemplified with a simple description to exemplify the inventive features. It is intended that this simple description be interpreted in a broad form to include more complex scanning arrangements such as having a greater number of scan positions, using devices other than the liquid crystal devices, being constructed with other techniques, providing continuous scanning in contrast to discrete scanning, and incorporating the various other teachings of this inventive feature.

For simplicity, this generalized scanner concept will be discussed for a multi-layered liquid crystal embodiment although other configurations will become ovious from the teachings thereof. A glass substrate 1222 may be composed of many layers of glass at different angles 1221 all stacked and bonded together and containing liquid crystal illumination amplifiers therebetween such as with well-known etched electrodes and liquid crystal material in each layer interface 1230-1237. Scanning is achieved by sequentially selecting different layers having different reflective angles to be reflective thereby reflecting illumination to or from different locations. For example, if device 1224 is an illumination sensor, scanner 1220 will sequentially detect illumination from illumination paths 1240-1247 as the scanning progresses along path 1223. Alternately, device 1224 may be an illumination source where an illumination signals 1240-1247 may be scanned across element 1223 for selective illumination. Illumination signals from a source 1224 may be further processed with well-known electronics. For example, illumination signals 1240-1247 may be accumulated with lens systems after illuminating scanned element 1223 for processing with illumination sensors.

In accordance with FIG. 12B, a plurality of illumination amplifier devices may be arranged having a dept dimension into the support medium such as a glass medium for liquid crystal devices, wherein the illumination must traverse transmissive illumination amplifier elements until it reaches a reflective element. For example, if a first element 1230 closest to the surface is reflective, illumination will be reflected in a direction 1240 determined by this surface element, and if the first element 1230 closest to the surface is transmissive, illumination will be transmitted to a second amplifier 1231 next closest to the surface through the first transmissive element 1230. If the second element 1231 is reflective, illumination will be reflected in a direction 1241 determined by this second element 1231 which is the first reflective element, and if the second element 1231 is tansmissive, illumination will be transmitted to a third amplifier 1232 next closest to the surface through the first two transmissive amplifier elements 1230 and 1231 and so forth until the illumination is incident upon a first amplifier having a reflective characteristic. This first amplifier having a reflective characteristic will determine the selected angle of the scanner. Therefore, the illumination from the source may be transmitted through a plurality of illumination amplifiers that and non-reflective until incident upon the first illumination amplifier that is reflective, thereby electro-optically selecting the particular scanner angle.

For simplicity of discussion, a sequential scanning arrangement of scanner 1220 will now be discussed. For simplicity of illustration, it shall be assumed that one and only one amplifier layer 1230-1237 of layers 1221 is controlled to be reflective and all other amplifier layers are controlled to be transmissive although other scans may be provided to make combinations of elements 1230-1237 reflective and transmissive. For a sequential scan, illumination amplifier 1230 is first controlled to be reflective thereby generating reflective illumination signal 1240, then amplifier 1230 is controlled to be transmissive and amplifier 1231 is controlled to be reflective thereby generating reflective illumination signal 1241, then amplifiers 1230 and 1231 are controlled to be transmissive and amplifier 1232 is controlled to be reflective thereby generating reflective illumination signal 1242, etc. The sequential scan may proceed as shown in the table listing Scan States. This table lists the repetitive sequence of scanner states and the transmissive and reflective elements for each state.

| | | SCAN STATES | | |
|---|---|---|---|---|
| SE-QUENCE | CONTROL SIGNAL | TRANS-MISSIVE SEG-MENTS | RE-FLEC-TIVE SEG-MENTS | ILLUMINA-TION SIGNAL |
| 0 | B0 | 1231-1237 | 1230 | 1240 |
| 1 | B1 | 1230, 1232-1237 | 1231 | 1241 |
| 2 | B2 | 1230-1231, 1233-1237 | 1232 | 1242 |
| 3 | B3 | 1230-1232, 1234-1237 | 1233 | 1243 |
| 4 | B4 | 1230-1233, 1235-1237 | 1234 | 1244 |
| 5 | B5 | 1230-1234, 1236-1237 | 1235 | 1245 |
| 6 | B6 | 1230-1235, 1237 | 1236 | 1246 |
| 7 | B7 | 1230-1236 | 1237 | 1247 |
| 0 | B0 | 1231-1237 | 1230 | 1240 |

When the last amplifier 1227 is controlled to be reflective to generate illumination signal 1247, then scanner 1220 may be controlled to "retrace" by making amplifier 1230 again reflective and thereby retracing from signal 1247 to signal 1240 to start a new scan along element 1223.

An alternate embodiment is illustrated with the following Alternate Scan States table.

| | | ALTERNATE SCAN STATES | | |
|---|---|---|---|---|
| SE-QUENCE | CONTROL SIGNAL | TRANS-MISSIVE SEG-MENTS | RE-FLEC-TIVE SEG-MENTS | ILLUMINA-TION SIGNAL |
| 0 | B0 | NONE | 1230-1237 | 1240 |
| 1 | B1 | 1230 | 1231-1237 | 1241 |
| 2 | B2 | 1230-1231 | 1232-1237 | 1242 |
| 3 | B3 | 1230-1232 | 1233-1237 | 1243 |
| 4. | B4 | 1230-1233 | 1234-1237 | 1244 |
| 5 | B5 | 1230-1234 | 1235-1237 | 1245 |
| 6 | B6 | 1230-1235 | 1236-1237 | 1246 |
| 7 | B7 | 1230-1236 | 1237 | 1247 |
| 0 | B0 | NONE | 1230-1237 | 1240 |

Many other alternate embodiments may be provided from the teachings herein.

The scanner inventive feature described above may be characterized as selecting a sequence of elements having different reflective angles to select each of a plurality of sources of illumination (or to select each of a plurality of destinations of illumination) having different angles of incidence (or having different angles of reflection) to provide substantially a constant reflective angle (or incidence angle) to provide reflected illumination to a sensor (or from a source). Other characterizations may include a solid-state scanning device, an electro-optical device for scanning a plurality of sources of illumination to provide scan illumination to a receiver, and a plurality of illumination amplifier devices each having different angular positions for selecting different sources of illumination for reflecting selected illumination to a receiver device.

The illumination amplifier scanner of the present invention may take many forms, where one form is a plurality of individual discrete illumination amplifier elements arranged at different angles. Another form may be provided as a batch fabricated illumination amplifier as shown in FIG. 4 where a plurality of illumination amplifier surfaces such as surfaces 440 and 457 may be sequentially selected to reflect (or transmit) different source images to a common receiver element. Still another embodiment may be a planner arrangement such as illustrated in FIG. 6A, where amplifier elements 602–605 may each be provided having a different angle and where each may be selected in sequence to be reflective to reflect different images to a common destination element. Other scanner embodiments may be arranged as concentric squares and circles as illustrated in FIGS. 8B and 8C, wherein each segment may be arranged at a different angular position. Other configurations may be provided such as determined by convenient manufacturing methods to provide a plurality of illumination amplifiers having different angular positions therebetween in accordance with the teachings of the scanner feature of this invention.

A multi-dimensional scanner arrangement may be provided having a two-dimensional angular orientation between a plurality of illumination amplifier elements. In one batch fabricated arrangement, a spherical surface may be provided having facets arranged about the surface of the spherical device having different orientations in two dimensions.

One optical scanner in accordance with the present invention may be characterized as a single photosensor with a plurality of electronically controlled amplifier elements each selecting a particular source or direction for reflecting to the single photosensor. The photosensor and associated electronics may be considered as being time-shared between a plurality of source elements selectable with the illumination amplifier elements.

The scanner feature of the present invention may be usable in place of present well-known scanner arrangements including the rotating mirror associated with a Zerox copy machine, the rotating mirror and photocell arrays associated with optical character recognition systems, a Vidicon and other tube scanners associated with television cameras, flying spot scanners, and other well-known scanning devices Scan control may be provided with the relatively simple counter and decoder arrangement of FIG. 12C or may be provided with higher capability electronics such as a digital computer controlled scan. In order to exemplify this feature of the present invention, a simple sequential scan arrangement will be discussed with reference to FIG. 12C. Sequential scanning may be controlled with binary counter 1204 being repetitively sequenced through eight counts under control of clock signal CK. The sequential binary count from counter 1204 may be decoded with decoder 1205 to generate one of eight control signals B0–B7 in response to the three binary encoded signals B, C, and D from counter 1204. Each of the eight control lines from decoder 1205 may be used to control a different amplifier segment of scanner 1200 (FIG. 2A) and a different amplifier level of scanner 1220 (FIG. 2B). For example, decoder output signals B0–B7 may control amplifier segments 1210–1217 respectively of scanner 1200 and may control amplifiers 1230–1247 respectively of scanner 1220. As counter 1204 sequences through the binary count, decoder 1205 sequences through the eight control signals B0–B7; wherein the selected control signal from decoder 1205 will cause the related segment of scanner 1200 to become transmissive (operating in the transmissive mode) and will cause the related amplifier of scanner 1220 to become reflective (operating in the reflective mode). Counter 1204 and decoder 1205 may be well-known Texas Instruments S/N 7400 integrated circuit logic wherein counter 1204 may be an S/N 7491 counter and decoder 1205 may be a S/N 7445 decoder.

For simplicity of discussion, mutually exclusive control has been described where one and only one segment of scanner 1200 is controlled to be transmissive and one and only one amplifier of scanner 1220 is controlled to be reflective, but many other combinations can be provided. For example, scanning may be random in nature for adaptive scanning or may be selective in nature to select a particular segment or angle without traversing a sequentail scan. Further, various combinations of segments and amplifiers may be controlled to be transmissive or reflective.

For further simplicity of discussion, the angular dimensions and resolution of amplifier segments 1210–1217 and amplifiers 1230–1237 are shown in exaggerated form. In other embodiments, the segments of scanner 1200 may have fine angular resolution such as 1024 segments being used instead of the eight segments of the present example. Further, the angles of amplifiers 1230–1237 of scanner 1220 may have greater resolution such as 1024 scanning angles in place of the eight angles of this example. Still further, the interchangability of the reflective and transmissive modes as discussed above permits the scanners to operate in either the reflective or transmissive mode. For example, scanner 1200 has been discussed for transmissive mode operation and scanner 1220 has been discussed for reflective mode operation, where alternately scanner 1200 may operate in the reflective mode and scanner 1220 may operate in the transmissive mode.

Still further, control may be provided in analog form wherein amplifiers 1210–1271 of scanner 1200 and amplifiers 1230–1237 of scanner 1220 may be controlled to to partially reflective and partially transmissive such as by using the pulse modulated control arrangement discussed with reference to FIG. 2.

Yet further, an analog scan may be provided by implementing continuously variable controls such as discussed in U.S. Pat. No. 3,675,988 to Soref, which is herein incorporated-by-reference, thereby providing a continuous scan in contrast to the discretely stepped scan discussed with reference to FIGS. 12A-12C.

A closed loop adaptive scanner embodiment will now be discussed with reference to FIG. 1. Command device 127 may be an adaptive command device such as a stored program digital computer or may be other well-known adaptive command devices. Command device 127 generates command signal 126 to the command signal processor 128, as previously discussed with reference to FIG. 1. Control signals 133 to amplifier 104 may control amplifiers 1210-1217 and amplifiers 1230-1237 (FIGS. 12A and 12B), wherein these amplifier elements are included in the general amplifier block 104. Illumination transmitted or reflected to illumination detectors as shown in FIG. 12 corresponds to illumination 110 to sensor 134 (FIG. 1). Sensor signal 114 may be communicated to adaptive device 127 as signals 139 for adaptive control. Command device 127 may command scanning or monitoring with a single amplifier angle and may adaptively change the monitored angle to optimize the feedback signal 139. Adaptive control with feedback to a digital computer is discussed in applications Ser. No. 134,958 and Ser. No. 135,040 for a machine control system and are equally applicable to the illumination control system of the present invention.

A specific use of the electro-optical chopper of the present invention will now be discussed in detail to exemplify the more general features of the present invention.

Mechanical chopper arrangments are well known in the prior art such as illumination choppers used for startrackers such as the Kollsman Automatic Astro Compass type KS-50-03. Such prior art devices provide a rotating mechanical shutter that permits incident light to be transmitted or blocked as a function of the angular position of the incident light and the phase of the mechanical shutter rotation.

In accordance with the teachings of the present invention, an illumination amplifier chopper may be provided using amplifiers 104 controlled by signals 133 to chop illumination 102 to generate chopped illumination 106. Amplifiers 104 may be arranged with segments having a particular orientation, discussed with the reference to FIG. 12A. Control signals 133 select the various segments in sequence, which may be a clockwise or counter-clockwise sequence as with the mechanical choppers or, in a preferred embodiment, may select the segments in a random access sequence such as may be defined under control of command divices 127 which may include a computer 251.

In a preferred mode of operation, an initial acquisition scan such as a complete clockwise scan using all segments may be performed to initially locate an image. After an image has been located, only segments closely associated with the image location may be scanned in an adaptive manner to increase the duty cycle of the chopped signal and to decrease the re-acquisition time. This adaptive capability provides significant advantages over prior art mechanical chopper arrangements, where mechanical choppers and other sequential devices do not provide selective or random access illumination chopping capabilities. The electronic control arrangement of the present invention permits external illumination to be chopped in almost any desired random order or sequence based upon optimizing the particular system considerations.

In contrast to prior art illumination chopper systems, the system of the present invention provides null seeking capability with a computer contained in command devices 127 (FIGS. 1 and 9B) for commanding the selective chopping of illumination with amplifiers 104 under control of command signals 126 to command signal processors 128 to generate control signals 133 to provide chopped illumination 106. Transducer 134 generates feedback signals 114 to signal processors 116, where computer 251 in command devices 127 is responsive to feedback signals 139 to determine the location of the illumination. Computer 251 and command devices 127 control the system to center the illumination such as by controlling a gimballed startracker to reposition the image in the telescope, as is well known in the art. Computer 251 would continually adjust such a controlled arrangement to center the illumination in response to the chopped feedback signals until incident illumination is centered, indicative of equal feedback signals when each of the illumination amplifier segments 104 were selected by computer 251.

In one embodiment of the scanning arrangement shown in FIG. 12A, digital counter 1204 included in command devices 127 generates binary output signals 1206 included in signals 126 to decoder 1205 included in command signal processor 128. Decoder 1205 decodes binary inputs signals 1206 to generate individual select output signals B0-B7 which sequentially select segments 1210-1217 or 1230-1237 to chop input illumination 102 to generate chopped output illumination 106 to illuminate transducer 134. The output of transducer 134 excites signal condition devices 116 to generate feedback signal 139 such as by loading the output of counter 1204 into the computer when the chopped signal 106 illuminates transducer 134. Therefore, the number loaded into the computer is indicative of the segment of chopper 104 upon which illumination 102 is projected, where the number loaded into the computer is indicative of the direction in which illumination 102 is off from the center 1201 of the chopper.

The number loaded into the computer may be used to identify the off-center condition of illumination 102 to process information, or to control the system, or both in response thereto using well-known prior art arrangements.

Chopper arrangement 1200 is shown in a simplified embodiment in FIG. 12A to exemplify the present invention. It will become obvious from the teachings of the present invention that more sophisticated arrangements may be configured, where the computer may directly or indirectly generate select signals B0-B7 in either a sequential form as described above or in a random access form to select particular segments in order to optimize system considerations.

Further, a computer may receive feedback signal 139 as a discrete input signal as described in the referenced copending applications to identify the segment illuminated by illuminatons 102. In one embodiment, computer 251 in command device 127 and command signal processor 128 may replace counter 1204 and decoder 1205 to generate select signals B0-B7 in a preferred sequence or in a random manner and may monitor output signal 139 of sensor 134 to determine the off-center direction of illumination 102. In another embodiment, the computer may select a particular segment 1210-1217, then monitor signal 139 to determine the illumination condition, then continue to interrogate the various segments 1210-1217 and, in conjunction with each interrogation, monitor signal 139 to determine the off-center direction of illumination 102. In still another embodiment shown in FIG. 9B, computer 251 may receive feedback signal 139 as a whole number digital signal from an anolog-to-digital converter 138 included in feedback signal processor 116 to define the relative amplitude of illumination intensity.

In yet another feedback embodiment discussed with reference to FIG. 12C, sensor 134 (also shown in FIG. 12A) may receive chopped illumination 106 (FIG 12A) and may generate feedback signal 114 to C-Register 1207 to load output signals 1206 from counter 1204 into C-Register 1207 in response to feedback signal 114. The contents of C-Register 1207, indicative of the angular position of incident illumination 102 (FIG 12A) may be loaded into computer 251 for control of scanner 1200 and for control of other system operations. Loading of C-Register 1207 and communication between C-Register 1207 and computer 251 is discussed in the referenced applications, particularly in applications Ser. No. 291,394.

Mechanical scanners are well known in the art and interfacing thereof may be used to interface the electro-optical scanner of the present invention.

A preferred arrangement for interfacing chopper 1200 with an electronic system such as with a computer will now be discussed with reference to FIGS. 12A and 12C. Chopping of illumination signal 102 to obtain chopped illumination signal 106 provides a phase relationship that determines the direction of offset of illumination 102 from being focused directly on the center 1201 of scanner 1200. Sensor 134 generates output pulse 114 when chopped illumination 106 illuminates sensor 134. This condition occurs when counter 1204 commands the segment that is illuminated by the off-center illumination, which is segment 1210 in the example shown in FIG. 12A, to be transmissive thereby illuminating sensor 134 with chopped illumination 106. Therefore, the state of counter 1204 when sensor 134 detects chopped illumination 106 identifies the segment transmitting the chopped illumination 106 and therefore identifies the direction of the incident illumination 102. The mechanization shown in FIG. 12C can provide feedback to an electronic system where sensor 134 generates output signal 114 when counter 1204 controls the segment having the incident illumination 102 transmitted thereon to be transmissive. Therefore, sensor signal 114 (FIG. 1) may be used to control loading of signals 1206 from counter 1204 into C-register 1207 for storing identification of the segment related to the direction of incident illumination 102. C-register 1207 may then be used as an interface register between scanner 1200 and an electronic system which may include a computer 251 (FIGS. 2C, 9B, and 12C).

The electronic system interface may be better understood relative to the disclosures in the referenced co-pending applications. For example, the C-register interface with a computer is discussed in detail in application Ser. No. 101,881; particularly with reference to FIG. 13 therein showing C-register 260. Further, a preferred embodiment of the C-register is discussed in application Ser. No. 291,394 particularly with reference to FIG. 7 therein. Said FIG. 7 shows C-register 460 being loaded with input signals 708 in response to load strobes $\overline{DC-7}$ and $\overline{DC-3}$ and the transfer of the loaded information from C-register 460 to A-register 706 in computer 112 as discussed therein, where strobe $\overline{DC-7}$ may be output signal 114 from sensor 134 discussed herein and in application Ser. No. 366,714. Still further, a sequence of control signals may be generated in response to an input signal with the mechanization disclosed in application Ser. No. 302,771; particularly with reference to FIG. 5 therein; wherein input signal 283 is processed with digital electronics to generate a sequence of clear signal 506 and enable signal 508 which may be used to clear and load the C-register; as discussed above for FIG. 7 of application Ser. No. 291,394; in response to the input signal 114 from sensor 134. Alternately, computer 251 may directly monitor output signal 114 of sensor 134 such as with a skip-on-discrete instruction and may directly control transmissivity and reflectivity of segments 1210-1217 such as by using the C-register discussed above as an output register.

An alternate embodiment wherein the computer is included in the feedback loop will now be discussed with reference to FIG. 12D. Computer 251 packs together a combination of one bits and zero bits in the internal A-register, wherein each packed bit corresponds to a different segment 1210-1217 of scanner 1200 and wherein a one state may define transmissivity and a zero state may control reflectivity for the corresponding segments 1210-1217. Such operations may be performed with well-known table lookup and packing operations. Computer 251 may then output the packed discrete word from the A-register to the interface C-register 1207, wherein the packed discrete conditions B0-B7 are stored in C-register 1207 to control segments 1210-1217 of scanner 1200. Computer 251 packs together and outputs a new control word B0-B7 to C-register 1207 for every scan increment such as for each desired change in transmissivity and reflectivity of one or more segments 1210-1217; which may be sequential changes implemented with well-known counting, polling, and/or indexing programming methods. Incident illumination 102 is conditionally transmitted or chopped by scanner 1200 to generate chopped illumination 106 to illuminate sensor 134. Sensor output signal 114 may be sensed directly by computer 251 such as with a skip-on-discrete instruction. Computer 251 may either sequentially scan, randomly scan, or adaptively scan illumination 102 by monitoring feedback signal 114 to identify the direction or other characteristics of incident illumination 102. Therefore, computer 251 in the scanning loop may reduce special purpose electronics and may provide flexibility and adaptive control. A preferred embodiment of such a computer is discussed in application Ser. No. 101,881; where the preferred embodiment includes a read only memory and a scratch pad memory in a micro-computer type configuration.

For simplicity of discussion, illumination signals between element 1224 and scanner 1222 are shown at different angles indicated by signal paths 1240-1247. These signals 1240-1247 inbetween scanner 1222 and generator 1224 may actually be colinear, parallel, or have other such relationships.

A scanner embodiment may be used for display purposes, wherein this scanner inventive feature will now be discussed with reference to FIG. 12B. In this embodiment, element 1223 may be a multi-character display and may be a frosted glass screen or other projection device and element 1224 may be a character generator such as a single liquid crystal character being controlled from well-known digital display electronics. Refresh electronics such as discussed in applications Ser. No. 101,881 and Ser. No. 288,247 may be used to display a sequence of characters with character generator 1224. The sequence of characters may be scanned onto element 1223 into sequential locations shown being illuminated by illumination signals 1240-1247. For example, time-shared character generator 1224 may be controlled to repetitively generate a set of eight sequential characters wherein sets of these eight characters may be continuously and repetitively refreshed or generated. As each character is sequentially generated, a related illumination amplifier 1230-1237 may be controlled to project the related character onto element 1223 in the desired position. In a preferred embodiment, each sequential character of the set generated with generator 1224 corresponds to a different scanner element 1230-1237 and therefore a different projection location identified with illumination signals 1240-1247; wherein character generator 1224 and scanner segments 1230-1237 may be correspondingly controlled in the sequential character generation and scanning process. For example, a first character of the set may be generated in combination with the first scanned segment 1230 being selected to project the first character in the set onto the location of project screen 1223 defined by illumination signal 1240. Correspondingly, as each of the set of eight characters is sequentially generated with generator 1224, one of the scanner segments 1230-1237 is selected for the corresponding character. This can be seen with reference to the scan table discussed above, wherein each sequential scan signal B0-B7 may select a different control signal or character to be projected along the appropriate illumination signal path of signal paths 1240-1247 respectively. During the repetitive scan cycle, the B0 control signal or character will always be projected with illumination signal 1240 as controlled with the scan mechanization discussed above relative to FIGS. 12C and 12D. Therefore, scanner 1220 of the present invention may be used to time share a single-character display to provide a multiple-character display; thereby providing a low-cost and efficient multiple-character display.

Display generator 1224 may be a very small display generator such as a miniature liquid crystal display character and operator display 1223 may be a large display such as an audience display. Proper introduction of well-known optics such as magnifying lenses inbetween display generator 1224 and scanner 1222 or inbetween scanner 1222 and screen 1223 may permit use of a small character generator 1224 and a large screen 1223.

Another feature of the present invention illuminates generator 1224 with a high intensity floodlight 1225, where this floodlight is shown illuminating generator 1224 in a transmissive mode but similarly may be used in a reflective mood. High intensity illumination of a small generator 1224 may be used in combination with magnification optics such as magnifying lenses placed inbetween generator 1224 and projection screen 1223 to provide high intensity large screen displays with a miniature character generator 1224 using low power electrical control signals to control or modulate high intensity illumination from floodlight 1225 in an illumination amplifier configuration. Further, generator 1224 may generate other symbols than characters such as a spot of light, a schematic symbol, or other such symbols. In such an embodiment, system 1220 may be used as a photo-plotter or display, wherein element 1223 may be an illumination sensitive medium such as film for permanent recordings, may be a frosted glass screen or a frosted coating for temporary displays, or may be other types of illumination sensitive or projection devices.

Scanners 1200 and 1220 are discussed above as single-dimension scanners for simplicity of illustration. It is herein intended that the teachings discussed with reference to FIG. 12 be interpreted as exemplifying multi-dimensional scanning capability. For example, the angular representations of elements 1230-1237 shown in an single-dimensional configuration may be similarly shown in a multi-dimensional configuration for scanning illumination signals in a plurality of dimensions. For example, linear screen 1223 may be replaced with a two-dimensional screen such as used in a television receiver and the signals may be scanned in various well-known patterns such as a raster scan used in a conventional TV receiver. Alternately, other well-known scans may be used such as radar related scans identified as Palmer scans, A-scans, and B-scans.

Other applications and other embodiments of illumination chopper arrangements will now become obvious to those skilled in the art from the teachings of this invention and from prior art control arrangements used in conjunction with mechanical chopper arrangements.

ILLUMINATION MODULATORS

The various arrangements described in application Ser. No. 366,714 for controlling illumination permits modulation of illumination for communication of information. The illumination amplifier arrangement shown in FIG. 1 may be used to modulate illumination signals for communication of information. Prior art systems modulate illumination by controlling the source such as with optical couplers using electrical signals for controlling a Light Emitting Diode (LED) source and such as with mechanical modulators used in Navy communication devices to flash digital signals between ships. The illumination amplifier arrangement of the present invention permits modulation of illumination signals for communication of information such as modulating source illumination 102 with amplifier 104 to provide modulated illumination 106; where receiver 112 may include a photocell in an optical coupler arrangement or other receiver or the receiver may be an operator visually monitoring modulated optical signals.

Figure 2A:
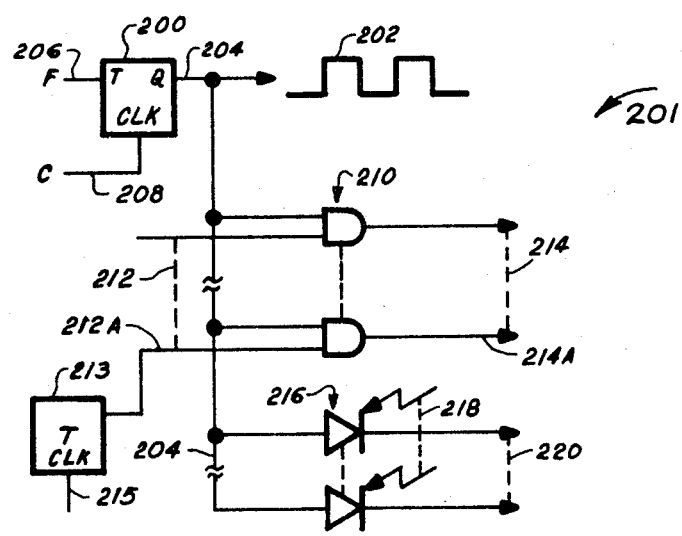
FIG. 2 illustrates various excitation arrangements for illumination amplifiers in schematic and waveform diagrams comprising FIG. 2A showing a digital excitation arrangement, FIG. 2B showing pulse modulation waveforms, FIG. 2C showing an analog excitation arrangement, and FIG. 2D showing pulse width modulation waveforms.
Figure 2C:
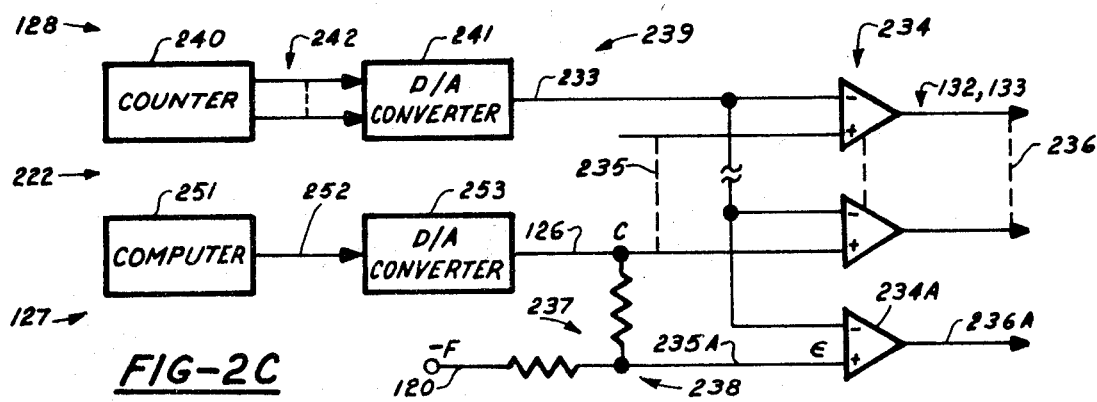
Figure 2B:
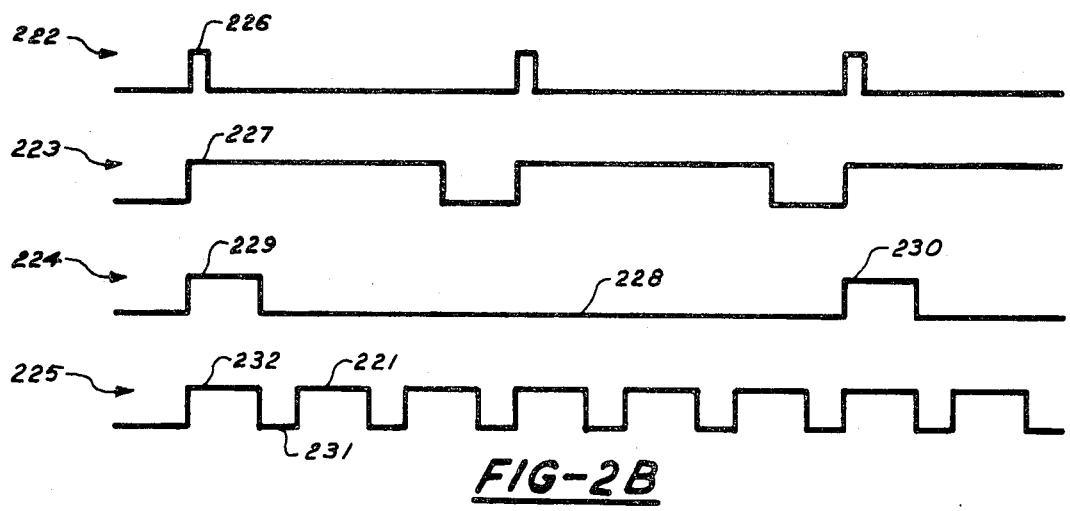
Figure 2D:
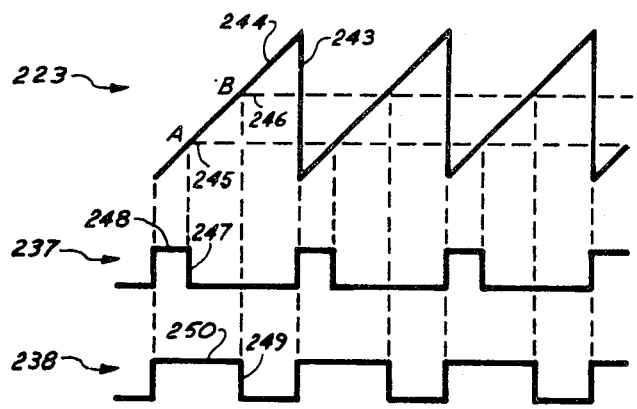

Digital modulation of illumination can be provided with logic arrangements as illustrated in FIG. 2A with gates 210 and flip-flops 200 and 213. In addition, well-known digital arrangements may be used to generate pulse code modulation, pulse width modulation, and other digital modulation arrangements. Signals 214 may be used to control illumination amplifiers to digitally modulate illumination signals. Further, a pulse width modulation arrangement is discussed with reference to FIGS. 2B-2D in application Ser. No. 366,714 to provide pulse width control for illumination amplifier devices. Further, as discussed in application Ser. No. 366,714; an analog amplitude control can be provided for illumination amplifiers that are responsive to analog amplitude signals for controlling illumination in response thereto.

Well-known optical coupler arrangements use a LED source and a photocell sensor to provide electrical isolation. In an improved arrangement, illumination amplifier 104 inbetween source 100 and photosensor 134 controls illumination 102 to be modulated under control of signal 133 to transmit illumination 106 conveying the desired information to photosensor 134.

Because of the solid-state characteristics of many source devices such as LEDs and the batch fabricated solid-state characteristics of illumination amplifier 104 and photosensor 134, a batch fabricated coupling arrangement can be provided. As an example, a monolithic array of source elements 100 may be provided using well-known integrated circuit technology and may be provided in combination with illumination amplifier devices in a batch fabricated configuration to control source illumination 102 with amplifier 104. The monolithic structure associated with solid-state source elements such as LEDs is typically a semi-conductor wafer and may be passivated with well-known techniques such as silicon dioxide. Illumination amplifiers may be constructed using glass substrates such as glass substrates for liquid crystal devices, where the silicon dioxide passivation provides an illumination amplifier substrate for combining source 100 and amplifier 104 structures in monolithic form. Further, well-known monolithic processes for producing photosensors 134 are also compatible with illumination amplifier technology. Therefore, illumination amplifier 104 may be configured in a batch fabricated monolithic form in conjunction with source 100, or photosensor 134, or both source 100 and photosensor 134.

As a further example, LEDs are packaged as individual components with a batch fabricated lens as part of the incapsulation package. Incorporation of illumination amplifiers as part of the lens structure or as part of the monolithic structure associated with source 100 provides a batch fabricated illumination element that is controllable with the very low levels of electric power.

DISCLOSURE FROM APPLICATION Ser. No. 730,756

Material filed with the present application has been cancelled and incorporated by reference from parent application Ser. No. 730,756. This material includes sections entitled Camera System Improvements, Movie Camera System; Computer Control Arrangement; Traffic Light Control, Operator Panel, Improved Slide Projector, Segment Arrays, Multiple Electrode Logic, Fringe Control, Integrated Electro-Optic Devices; and Improved Fiber Optic Arrangement; which material can be found at pages 132 through 164 in parent application Ser. No. 730,756; and which material is herein incorporated-by-reference therefrom as if fully set forth at length herein. FIGS. 1–13 herein are described in detail in this material that is incorporated-by-reference.

Secrecy of the disclosure and only the disclosure of parent applicaton Ser. No. 730,756 is hereby waived; where the disclosure of parent application Ser. No. 730,756 as-amended is hereby opened to the public to the *limited* extent that a requestor be "allowed to order a copy of only that portion of the patent application that relates to the common subject"(MPEP 103); which is *limited* to ordering a copy of *only* the disclosure as-filed and amendments to the disclosure of parent application Ser. No. 730,756. Secrecy is expressly *not* waived for portions of the file of parent application Ser. No. 730,756 that do not relate to the disclosure as-filed and the amendments to the disclosure such as arguments, Actions, claims, claim amendments, etc. except as determined by the patent office to be necessary to facilitate the doctrine of incorporation-by-reference.

ADDITIONAL CONSIDERATIONS

The arrangements and methods described herein and in application Ser. No. 366,714 are useful individually and in combinations and further may be used in many new and unique applications either individually or in combinations to provide improvements in prior art equipment and methods. Some of these new and unique applications are described hereinafter exemplary of the broad range of applicability of the features of the present invention. It is intended that these specific applications discussed hereinafter be exemplary of the very broad applicability of the features of the present invention.

The system of this invention is discussed relative to photo-electric devices such as the well-known liquid crystal devices. Many of the applications described herein may be described in terms of the "illumination amplifier" concept and embodiment. It is herein intended that the scope of this invention be broadly interpreted and be applicable to a wide range of electro-optical, electro-chemical, and other such devices for controlling illumination that may be used to provide the capabilities described herein which are exemplified with liquid crystal devices.

Further advantages may be achieved by using the features of the instant illumination amplifier invention in combination with a coherent illumination source such as a laser. The combination of a plurality of illumination signals such as a plurality of coherent signals may also be combined with non-coherent signals and may be processed with the illumination amplifier inventive features. For example, the multiple illumination signals shown in FIG. 5 may be combinations of coherent and non-coherent signals. In various embodiments signals 510, 520, and 522 may all be coherent laser-type signals, may all be non-coherent signals, or may be combinations of coherent and non-coherent signals such as signals 510 and 520 being coherent and signal 522 being non-coherent or conversely signals 510 and 520 being non-coherent and signal 522 being coherent.

The use of illumination amplifiers in combination with lasers provides important advantages, wherein laser systems often utilize beam splitters, mirrors, and transmitters. The electronically controllable reflectivity, transmissivity, absorbtivity, and other characteristics of illumination amplifiers permits convenient electronic control of laser illumination. Control of the reflectivity and transmissivity of an illumination amplifier is discussed with reference to FIG. 3 where for example amplifier 340 may be an electronically controllable beam splitter which is controlled with electronic signal D providing transmitted signal 342 and reflected signal 343 from incident signal 341.

Another feature of the present invention is the use of illumination amplifiers in combination with surface acoustic wave (SAW) devices. SAW devices are well known in the art and are exemplified with a piezo-electric crystal that generates and propogates acoustic surface waves in response to electrical excitation. A combined acoustical and optical arrangement provides particular advantages. For example, the integration of an SAW device and an electro-optical device such as a liquid crystal device can be used to provide combinations of capabilities. This can be exemplified by placement of a liquid crystal device on the surface of an SAW device such as with well-known electrode deposition on an SAW device which is then covered with a glass substrate and filling with liquid crystal material to provide an integrated LCD and SAW. This may be seen with reference to FIG. 4 where element 434 may be the SAW device, gap 436 may be filled with liquid crystal material, and substrate 402 may be a glass substrate or may be a portion of the batch fabricated illumination computer discussed with reference to FIG. 4 in application Ser. No. 366,714. Surface acoustic waves propogating over the surface of SAW device 434 can modulate the illumination reflected therefrom such as illumination 460 and 466 to provide reflected illumination modulated with the acoustic wave information. Many other embodiments and uses will now become obvious from the teachings herein.

Time sharing of excitation devices is enhanced by providing memory elements with illumination amplifier devices, where memory elements such as flip-flops and capacitors can be provided to store excitation signals for illumination amplifiers. Memory elements may be refreshed or updated with excitation electronics 127 and 128 using refresh methods provided in application Ser. No. 288,247. The excitation electronics need not continuously excite illumination amplifier devices 104 having memory devices contained therewith. Time shared excitation devices may be defined as devices that excite an illumination amplifier for a limited period of time, then terminate the excitation of that particular illumination amplifier element to provide excitation for another illumination amplifier element. Capacitor devices may be provided as batch fabricated devices, where illumination amplifier substrates may provide capacitive effects that may be sufficient for exciting the illumination amplifier devices. In another embodiment, capacitors may be formed with thin and thick film techniques and constructed as part of the illumination amplifier structure or may be constructed as separate components mounted on the illumination amplifier structure to provide the batch fabricated arrangements.

An illuminated switch arrangement will be described hereinafter using a capacitor memory to store a switch display condition. Such a memory arrangement is exemplary of the broad teachings of the present invention, where the capacitor memory arrangement may be used in conjunction with illumination amplifier devices in other applications. In general, time sharing of command devices and command signal processors 127 and 128 between a plurality of illumination amplifier devices is enhanced with memory devices such as a capacitor for signal storage. Other memory devices such as flip-flops may also be used in conjunction with illumination amplifier devices. In a preferred embodiment, a batch fabricated illumination amplifier and memory arrangement provides further advantages such as low cost, small size, and greater performance.

Modern integrated circuit technology is based upon monolithic elements of low power capabilities communicating in the monolithic domain with other low power devices. Typically, external components require complex interface drivers to amplify low power levels of the monolithic devices to drive interface lines and to control higher powered external devices which may be discrete elements such as light emitting diodes, display tubes, and other such components. The availability of a low power illumination control device such as the illumination amplifier arrangement described herein provides direct drive capability from the low power monolithic elements to low power illumination amplifier elements which can operate directly from monolithic circuit output signal levels.

One application of the low power capability of illumination amplifier devices is an automobile which may use monolithic digital devices such as the monolithic computer described in application Ser. No. 101,881 which may be implemented with well-known CMOS integrated circuit techniques for low power consumption and controlling many illumination signals within a vehicle. Such a monolithic computer can be used to control brake lights, flashing turn signals, dash lights, head lights, and other illumination devices in the vehicle using illumination amplifiers directly operable from the output signals of the monolithic computer. In such an application the monolithic computer may receive a plurality of input signals and control the illumination amplifiers in response thereto. A turn signal control such as a switch may be interrogated by such a computer, where the computer may generate command signals to a turn signal related illumination amplifier to control flashing thereof. Alternately, a brake control such as a switch may also be interrogated by such a monolithic computer, where the computer may generate command signals to a brake light related illumination amplifier in response to the brake command signal. Further, headlight control may be implemented with low level command signals from a monolithic computer controlling headlight illumination amplifier devices.

Still further, electronically controllable illumination amplifiers may be used in combination with various coatings such as dielectric coatings, ceramic coatings, and other coatings to provide further advantages in the combination thereof which advantages are well known in the art. Although certain types of illumination may tend to degrade optical coatings and illumination amplifiers. This degradation can be minimized using well-known chemical methods or by using low energy illumination. Although degradation is a consideration, degradation need not be a major limitation as indicated by material degradation in important technologies such as cathode degradation in the vacuum tube technology. Therefore, degradation characteristics are herein noted merely for completeness. Optical coatings and characteristics are discussed in the article Dielectric Cavity Laser YAG Efficiency by Hahn and Hahn in Electro-Optical Systems Design magazine dated February 1975 herein incorporated-by-reference.

In another embodiment, an illumination dimmer may be implemented as a pair of sunglasses constructed with illumination amplifier eye-pieces. The low power requirements of many types of illumination amplifiers will permit a small battery and excitation device to be provided in a portable configuration which may include an operator control such as a potentiometer for operator adjustment to provide the desired dimming characteristics. The illumination dimmer embodiment is discussed in application Ser. No. 366,714.

Color control arrangements are discussed in application Ser. No. 366,714. Still another arrangement may be implemented by using illumination amplifier material such as liquid crystal material having a particular spectral characteristic such as by adding color elements to liquid crystal material or providing a liquid crystal material having a self-contained or inherent color characteristic. Yet another arrangement provides a substrate with a particular spectral response such as a colored glass substrate used in combination with a liquid crystal device.

Photographic arrangements are discussed in application Ser. No. 366,714. In one embodiment, control of exposure in response to artificial illumination such as for flash photography may be provided in an adaptive manner with the photographic camera system of this invention. As shown in FIG. 1, illumination 102 from source 100 is controlled by signal 132; where source 100 may be a well-known photographic flash device. Illumination receiver 134, which may be a photocell responsive to illumination from source 100, generates feedback signals 114 provided as feedback signals 120, 124, or 139 which may be used to control source 100 with signals 132 and to control amplifier 104 with signals 133 to provide desired source illumination 102 and exposure illumination 106. These feedback control signals may be used to minimize required source energy such as from a battery by de-energizing source 100 when sufficient illumination has been provided as detected with transducer 134. Further, control of amplifier 104 may be used to control the precise amount of illumination that is exposing film 130 as discussed in detail in application Ser. No. 366,714.

PERTINENCE OF MATERIAL INCORPORATED-BY-REFERENCE

The instant application (as with the parent application Ser. No. 366,714) incorporates-by-reference copending applications and patents that contribute to the disclosure of the present invention. The pertinence thereof will now be discussed.

The pertinence of copending application Ser. No. 101,881 will now be discussed.

FIG. 1 of application Ser. No. 101,881 sets forth a data processor 12 for controlling machine 24 with servos 20–22 and discrete control signals 26 and with operator panels 14 and 18. Control of machine 24 with servos and discrete controls is similar to control of the illumination amplifiers of the present invention with servos and discrete control devices. For example, the machine control servos are disclosed using pulse-modulated methods similar to the methods discussed in the instant application. Further, discrete signals can also be used for controlling illumination amplifiers and for providing computer feedback from illumination amplifiers. Still further, the discrete and alpha-numeric displays of display panel 18 can use the illumination amplifier arrangements of the instant application and control panel 14 can use the illuminated switches of the present invention, thereby further describing the usage environment of the illumination amplifier displays.

FIG. 2 of application Ser. No. 101,881 sets forth the detailed operator control and display panel environment for usage and operation of the illumination amplifier devices of the present application. In particular, FIGS. 2C and 2D provide the interface between a monolithic computer and an operator panel which can incorporate the illumination amplifier features of the present invention. Further, this computer interface is exemplary of more general used discussed in the instant application for control of illumination amplifiers with a digital computer.

FIGS. 3 and 16–19 of application Ser. No. 101,881 exemplifies a servo control with a computer interface, wherein the computer-commanded servo control is usable with the illumination amplifier devices of the present invention in substitution for machine tool 24 of the embodiment discussed in application Ser. No. 101,881.

FIGS. 5–12 of application Ser. No. 101,881 sets forth architecture of one embodiment of a monolithic computer exemplary of the more generalized computer usable with the illumination amplifier features of the instant invention.

FIG. 13 of application Ser. No. 101,881 exemplifies input and output control between a computer and external devices which may be the illumination amplifier devices of the present invention. For example, discrete inputs DI-0 to DI-11 may be used to monitor discrete states such as sensor signals that monitor controlled illumination. Discrete outputs $\overline{DO\text{-}1}$ to $\overline{DO\text{-}11}$ may be used to control illumination amplifier devices such as by exciting the illumination amplifier either with a static DC output level set into a flip-flop such as by toggling flip-flops I1 to I4 with discrete outputs $\overline{DO\text{-}8}$, $\overline{DO\text{-}4}$, $\overline{DO\text{-}5}$, and $\overline{DO\text{-}6}$ respectively; or by directly pulsing the illumination amplifier device such as with a pulse rate modulated signal; or otherwise controlling illumination amplifiers through well-known interface electronics under discrete output control. Whole word outputs OW-0 to OW-11 may be used to generate whole number commands such as with packed discretes to the lamps discussed with reference to OW-11 outputs, or to numeric displays discussed with reference to OW-9 outputs, or with analog magnitude information to a digital-to-analog converter which is exemplified with the disclosure set forth in copending applicaton Ser. No. 325,933 discussed hereinafter. Latched discretes and control signals are shown generated with the OW-8 signal loading C-register 260 and generating the C6Q to C15Q signals. Input word signals IW-0 to IW-7 are shown loading feedback information into the computer such as packed discretes from sensors; whole number digital signals from an analog-to-digital converter such as disclosed in application Ser. No. 325,933 discussed hereinafter; or other computer input signals.

FIGS. 14A and 14B of application Ser. No. 101,881 further exemplify computer inputs such as loading packed signals T0–T8, P0–P3, M0–M2, J0–J2, and S0–S11 into the computer and also exemplify the output of packed control signals from Z-register 268 with storage flip-flops Z0–Z11.

FIG. 15 of application Ser. No. 101,881 discloses packed output control signals TS-0 to TS-7 and encoded input signals S0–S3 and others.

FIGS. 16–19 of application Ser. No. 101,881 disclose a servo arrangement that is exemplary of servos that may be used for illumination control in place of the machine control.

The pertinence of applications Ser. No. 134,598 and Ser. No. 135,040 will now be discussed. These applications are directed to servo control of a machine with a computer, wherein the machine servo control is also exemplary of an illumination amplifier servo control. This control is disclosed using hardwired servo loops commanded by a computer in an open-loop fashion and also in an alternate embodiment with the computer being in the servo loop. Further, pulse modulated control under computer program control is disclosed wherein the computer may be in the servo loop directly exciting the control device which may be an illumination amplifier and by directly monitoring the feedback device which may be an illumination sensor.

The pertinence of copending application Ser. No. 288,247 will now be discussed. In particular, application Ser. No. 288,247 is directed to interaction between the operator panel and the computer of the above-discussed application Ser. No. 101,881; wherein the computer flow diagrams of FIGS. 3 and 5–7 of application Ser. No. 288,247 disclose the processing and communication implemented with the hardware diagrams of FIGS. 1, 2, 8, and 9 corresponding to related figures of application Ser. No. 101,881 as discussed above.

The pertinence of copending application Ser. No. 291,394 will now be discussed. This application is directed to control of a machine by a computer using discrete signals which is exemplary of control of the illumination amplifier arrangements of the present invention with a computer using discrete signals. FIGS. 1, 2, and 4-6 of application Ser. No. 291,394 are similar to related figures of application Ser. No. 101,881 but application Ser. No. 291,394 provides more detailed disclosure relative to discrete control. In application Ser. No. 291,394; FIG. 7 provides a more detailed disclosure of a discrete input and output interface for the computer and FIG. 8 provides program control disclosures relative to controlling of external devices; exemplary of control of illumination amplifier devices with discrete signals.

The pertinence of application Ser. No. 302,771 will now be discussed. This application is also directed to control of a machine with various control methods including servos and adaptive control; exemplary of control of illumination devices in accordance with the present invention. FIGS. 1, 2, and 4A of application Ser. No. 302,771 are similar to related figures in application Ser. No. 101,881 as discussed above. FIGS. 3 and 4B of application Ser. No. 302,771 are exemplary of control arrangements applicable to the illumination control devices of the instant application. FIGS. 6 and 8 of application Ser. No. 302,771 are exemplary of signal processing for control of devices and are directly usable with illumination devices. FIGS. 7 and 10 of application Ser. No. 302,771 are exemplary of computer operations for control of devices such as the illumination devices of the present invention.

The pertinence of copending application Ser. No. 325,933 will now be discussed. Although this application is directed to audio response, many of the audio control functions are exemplary of illumination control functions. FIGS. 1 and 2 of application Ser. No. 325,933 are similar to related figures of copending application Ser. No. 101,881 discussed above and are discussed in greater detail in application Ser. No. 325,933. FIG. 3 of application Ser. No. 325,933 sets forth a detailed analog-to-digital converter, digital-to-analog converter, and computer input/output structure usable in combination with the computer operations of FIG. 6 and are exemplary of generalized converter input/output operations usable with the illumination devices of the present invention. FIG. 5 of application Ser. No. 325,933 is exemplary of generalized computer operations of controlling external devices which may be the illumination devices of the present invention.

The pertinence of copending application Ser. No. 550,231 will now be discussed. This application is directed to filtering, signal processing, communications, and memory systems which may be implemented with illumination devices disclosed in the instant application. For example, analog and digital illumination computing devices disclosed with reference to FIG. 3 of the instant application may be used to implement the devices of application Ser. No. 550,231 such as disclosed in FIGS. 4, 6, and 7 therein. Further, the illumination devices of the instant application may be usable in combination with or in replacement of the CCD devices of application Ser. No. 550,231 as set forth in FIG. 9 therein.

In view of the above, the disclosures of the referenced copending applications herein incorporated-by-reference exemplify arrangements and methods that are usable with the illumination devices of the present invention and are intended to be usable in combination therewith. For example, the servo control arrangements disclosed in said copending applications are intended to be used in replacement for the servo control arrangements disclosed in the instant application and are in general intended to be usable in combination with the illumination control devices of the instant application. Further, the computer control and interaction disclosed in said copending applications is intended to be usable in combination with the illumination control devices of the present invention where for example the computer 251 disclosed in FIGS. 2 and 9 of the instant application is intended to be supplemented with the computer disclosure of said copending applications.

PROJECTION DISPLAY ARRANGEMENT

An illuminating amplifier projection display arrangement in accordance with the present invention has been described in parent U.S. Pat. No. 3,986,022 and in copending application Ser. No. 727,330 wherein the following discussions will more specifically describe preferred embodiments thereof.

Conventional display arrangements typically require an image generator to generate the illumination as a source, wherein the illumination generated by the image generator such as a conventional television (TV) receiver therefore has relatively low intensity. It is well known that projection and magnification of an image reduces intensity of the image. Therefore, it was not practical to project prior art images generated with such image generators. In accordance with the present invention, an image generator is provided that is an illumination amplifier which controls externally generated illumination such as through reflectivity and transmissivity characteristics of the illumination amplifier. Therefore, intensity of the image is a function of intensity of the incident illumination controlled with the illumination amplifier image generator, where very high image intensities may be provided by illuminating the amplifier image generator with high intensity illumination. In accordance with the illumination amplifier feature of the present invention, an image generator may be used in a magnifying projection display system providing high intensity magnified projection displays by illuminating an amplifier image generator with high intensity illumination.

The projection display feature of the present invention will now be discussed in the embodiment of a projection audience display system and particularly in the embodiment of a large screen television display. This preferred embodiment is intended to exemplify but not to limit the general features of the projection display system of the present invention.

A basis for the inventive features discussed hereinafter are set forth in parent U.S. Pat. No. 3,986,022; other related applications discussed therein; and copending application Ser. No. 727,330. For example, the general features of excitation; batch fabrication; closed loop control; computer control; camera systems; choppers, scanners, and modulators; traffic light controls; and other such implementations discussed in said related patents and applications are directly applicable to the projection display system and are intended to be used in combinations therewith. For example, said U.S. Pat. No. 3,986,022 and application Ser. No. 727,330 discloses a large screen audience display system at pages 104-109, a television display at page 109 lines 28-32, a CRT embodiment at page 84 lines 8-11, a camera embodiment at pages 84-96, color control at pages 61-63 and pages 106-109, multiple source control at pages 99-103, high intensity projection at page 104 lines 28-35, closed loop control at pages 46-49, storage of displayed signals such as with a capacitor at pages 58-60, and batch fabricated arrangements such as at pages 41-45.

Further, copending application Ser. No. 727,330 includes the above disclosures in addition to the disclosures of television embodiments and scanning embodiments at page 128 lines 21-35, projection of magnified high intensity images at page 128 lines 1-12, a slide projector embodiment at pages 146 and 147, fiber optic embodiments at pages 163 and 164, batch fabricated arrangements at page 159 line 30—page 160 line 16 and computer control at pages 139 and 172-177 therein.

It is herein intended that the above-listed disclosures from all copending applications and the other disclosures from said copending applications be considered as usable with the projection display system and are intended for use in combinations therewith, wherein the use of these disclosed implementations and methods may be applied to the projection display system of the present invention in a manner that will become obvious to those skilled in the art from the teachings herein. For example, the projection display system may be batch fabricated, may use fiber optics, may be projected such as with slides or movies, may be projected with high intensity and magnification characteristics, may utilize computerized closed loop control, may use a light pen, may use circuitry discussed for illuminated switch signal storage, may use color control, may be used to expose an illumination sensitive medium, may use multiple sources and multiple colors, and may be used in conjunction with other teachings provided in the instant application and in the referenced copending applications.

A preferred embodiment of the projector arrangement will now be discussed with reference to FIG. 14. Projector 1410 including illumination amplifier 104 generates projected illumination 1414 to a projection screen 1451. Projector 1410 includes image generator 1450 and post-optics 1436. Image generator 1450 generates controlled illumination 1435 and 1437 to post-optics 1436 for post-processing of illumination to generate projection illumination 1414. Post-optics 1436 may be composed of conventional optics arrangements and may include magnifying optics such as provided in conventional projectors including slide projectors and movie projectors. Image generator 1450 may include illumination source 100 which may be any of many well-known sources including light bulbs such as projector bulbs and may be other types of illumination sources such as flame sources used on the well-known searchlights. Source 100 may be controlled with control signal 132 generated with control electronics 127, 128 as discussed in U.S. Pat. No. 3,986,022 with reference to FIG. 1 therein. Illumination from source 100 may be high intensity illumination for projection display and may be concentrated with reflector 1441 which may be a well-known reflector arrangement such as used on flashlights, slide projectors, or searchlights. Source illumination 102 may include direct illumination from source 100 and reflected illumination from reflector 1441. Source illumination 102 may be pre-processed with pre-optics 1433 which may include well-known optical devices such as accumulating and focusing lenses. Pre-processed illumination 1434 from pre-optics 1433 may be controlled with illumination amplifier 104 for generating illumination images. Illumination amplifier 104 may operate in a transmissive mode generating transmissive image 1435 or may operate in a reflective mode generating reflective illumination 1437. Illumination amplifier 104 may operate in response to control signals 133 from control devices 127, 128 as discussed in U.S. Pat. No. 3,986,022 with reference to FIG. 1 therein.

Illumination images 1435 and 1437 may be processed with post-optics 1436 for focusing, magnification, and other well-known optical functions. In a simplified embodiment, projector 1410 may be a well-known slide projector having an illumination source 100, reflector 1441, pre-optics 1433, and post-optics 1436; wherein illumination amplifier 104 may be substituted for the well-known slides in the slide projector.

Illumination amplifier 104 may be a monochromatic arrangement for generating a single-color image 1435 and 1437 or may be a multi-colored arrangement for generating colored images 1435 and 1437; where color arrangements are discussed with reference to FIGS. 6D and 11 of U.S. Pat. No. 3,986,022. In one embodiment, color may be introduced using a colored source 100, colored filters in pre-optics 1433, colored filters in post-optics 1436, or colored segments of illumination amplifier 104. Other methods of introducing color will now become obvious from the teachings herein.

Projection screen 1451 may be any well-known screen. For example, conventional movie and slide projector screens may be used for screen 1451. Alternately, screen 1451 may be a wall of a building which may have a desired coating such as a light colored paint, beaded material, or other such coatings. Alternately, screen 1451 may be a frosted glass screen or other screen material which might be illuminated from one side and viewed from the other side. Screen 1451 may be part of projector 1410 such as with the self-contained screens in TV sets or may be a remote screen such as a slide projection or movie projection screen located remotely from projector 1410. Further, screen 1451 may be a scoreboard, billboard, or other large-scale outdoor-type screen. Yet further, screen 1451 may comprise a plurality of different screens an post-optics 1436 may include prism or beam splitter type optics to project each of a plurality of identical images 1414 on different ones of a plurality of screens 1451 for viewing from different locations such as different sides of a scoreboard.

An alternate embodiment for a color projector will now be discussed with reference to FIG. 14B. Multiple-color projector 1411 comprises three channels of projectors similar to projector 1410 discussed with reference to FIG. 14A. Each of the three image generators 1450 may generate either transmitted or reflected illumination images to post-optics 1436 to generate projected image 1414. Each channel, comprising image generator 1450 and post-optics 1436, may represent a different color such as red, green, and blue colors indicated by the R, G, and B symbols associated with the three related channels of illumination. Triple image generators 1452 may generate transmitted illumination 1435, reflected illumination 1437, or combinations thereof. Triple post-optics 1454 may project the three colored illumination beams to screen 1451 so that all three colored beams 1415 are superimposed and have registration therebetween to provide a focused image on screen 1451 that represents the combination of all three colored images 1415.

Another alternate embodiment will now be discussed with reference to FIG. 14C. Triple-image generator 1452 may generate three illumination images which may be transmitted illumination 1435 or reflected illumination 1437 or combinations thereof for processing with combined post-optics 1455. Combined post-optics may combine the three illumination beams such as with accumulating and focusing lenses to generate a single combined colored image beam 1416 for projection onto screen 1451.

Still other alternative embodiments will now be discussed with reference to FIGS. 14D and 14E which represent reflection projection arrangements in contrast to the transmission projection arrangements discussed with reference to FIGS. 14A–14C. In these embodiments, projectors 11410–1412 generate projection illumination 1414–1416 which is reflected from image reflector 1442 to focus on screen 1451. Reflector 1442 may be a magnifying reflector for accumulating, magnifying, focusing, and projecting the image onto screen 1451 as reflected image 1417. A single beam projector 1410 and 1412 (FIG. 14D) generates projected images 1414 and 1416 respectively as discussed with reference to FIGS. 14A and 14C. A triple beam projector 1411 (FIG. 14E) generates triple image beams 1415 in a reflection embodiment as discussed with reference to FIG. 14D above using reflector 1432 to reflect images 1417 to screen 1451.

Projector 1410 may include a zoom capability. The zoom capability which may be implemented electronically or optically. For the electronic implementation, command arrangement 127 and 128 generating control signals 133 may computationally enlarge the image by controlling amplifier 104 to generate a larger optical image under electronic control. Alternately, post-optics 1436 may include a zoom lens capability such as used on slide and movie projectors and other well-known systems to enlarge or reduce image 1414 projected on screen 1451. Zoom capability may be either manual or automatic as implemented in well-known projection systems.

A large-screen-projection television embodiment will now be discussed with reference to FIG. 14. Advances in prior art TV systems and known projection TV systems are discussed in the article New Season's Color TV Sets Slate Major Role For Large Scale Integration by Gerald M. Walker in the Sept. 30, 1976 issue of Electronics magazine which is incorporated-by-reference herein. This article points out the importance of projection TV systems and the configuration of prior art systems. Such prior art systems use projection tubes, projection lanterns, CRTs, and a trinitron tube; where a major limitation of these prior art arrangements is the low intensity levels available with these projectors. The illumination amplifier feature of the present invention solves the intensity problem and permits a fully solid-state arrangement using low voltage electronics which eliminates vacuum tubes and expensive high-voltage electronics.

In prior art systems, the image generator such as the cathode ray tube (CRT) must generate the image having the desired intensity. The intensity available with CRTs and other such devices is very low and not practically suitable for projection particularly for projection of large images with significant magnification. The image generator of the present invention does not generate its own illumination but controls externally generated raw illumination as an illumination amplifier. For example, illumination amplifier 104 is not a source of illumination but merely modulates or amplifies illumination from source 100, wherein low level electrical signals 133 may be used to control high intensity images 1435 for projection with post-optics 1436. It is estimated that intensity of image 1435 using illumination amplifier 104 may be hundreds or thousands of times more intense than the intensity of images generated with conventional techniques such as CRTs. For example, conventional televisions using CRTs are marginally acceptable, where the CRT is adequate for a darkened room and a non-projection system. If a 24-inch CRT TV picture were projected to a four-by-six-foot large screen, the intensity of the projected image would be approximately one-sixth of the intensity from the CRT in a non-projection configuration. Obviously, this one-sixth of normal TV intensity would be inadequate. Therefore, exotic techniques, higher voltage circuitry, and other expensive methods are used to increase image intensity using conventional techniques.

In the system of the present invention, a small illumination amplifier device 104 may be used in conjunction with a high intensity source 100 to generate high intensity large-screen projection images 1414. Present photolithographic integrated circuit techniques make it relatively simple to provide small 0.001-inch elements on a substrate. Therefore, the 512-by-512-point resolution of a TV CRT may be implemented on an illumination amplifier device such as a liquid crystal device of approximately one inch square. Illumination of a small image such as a one-inch-square image formed on illumination amplifier 104 using high intensity raw illumination 1434 will permit projection and magnification of the small image to large dimensions with post-optics 1436 for projection onto screen 1451.

In a TV embodiment, conventional TV signals may be received and processed with conventional TV electronics. Video signals may be electronically scanned across illumination amplifier 104 with well-known electronic scanning methods such as the TV raster scan. Each amplifier element may have a memory element related thereto such as a flip-flop or capacitor as discussed with reference to FIG. 6C in U.S. Pat. No. 3,986,022. Accessing of an array of elements such as liquid crystal elements is well known in the art such as two-dimensional coincident excitation arrangements used with core memory systems.

The projector arrangement discussed above will now be discussed with reference to FIG. 14F to illustrate use in a complete TV receiver system. TV signal 1459 may be received with TV receiver 1460 comrpising well-known antennas and tuner, RF, video, IF, and audio circuitry to generate video signals 1461 to TV signal processor 1462. Signal processor 1462 may include well-known TV signal processing circuitry such as used with well-known solid-state image generators. Control 127 and 128 generates control signal 133 in response to processed signal 1463; wherein signal 133 may include scan control and intensity control signals and may further include pulse width modulated or other signal characteristics such as discussed in said U.S. Pat. No. 3,986,022. Control signal 133 controls illumination amplifier 104 to control illumination 1434 to generate controlled illumination 1435, 1437 which is projected with post-optics 1436 as projected signal 1414 to illuminate screen 1451; as discussed with reference to FIG. 14 herein.

In view of the above, it can be seen that the arrangement disclosed in FIGS. 14A–14E can be implemented in combination with well-known TV front-end circuitry to provide an implementation of a complete TV receiver.

The arrangement discussed with reference to FIG. 14 may be implemented in the form of a conventional projector arrangement such as a TV receiver or in the form of a holographic projector. In the conventional projector arrangement, source 100 may be a non-coherent illumination source such as a zenon lamp, mercury vapor lamp, incandescent lamp, or other well-known lamps which may be of a high intensity variety and illumination amplifier 104 may provide conventional images such as viewed on a conventional TV display. Alternately, this projection system may be implemented with a coherent illumination source 100 such as a laser or other coherent source and illumination amplifier 104 may display holographic patterns such as interference patterns for generating and projecting holographic images as images 1435, 1437, and 1414. In a conventional projection arrangement, a projected illumination image may be projected upon a screen to provide a two-dimensional image. In the holographic embodiment, illumination images 1435, 1437, and 1414 may be holographic images and may be projected on a screen such as screen 1451 or may be projected without a screen for providing three-dimensional holographic images.

In accordance with the holographic projector arrangement discussed above, a holographic TV camera can be provided, wherein holographic images may be provided with the appropriate optics such as lenses and a conventional television camera may be used to take moving video pictures of the holographic interference patterns for transmission to the receiver, discussed with reference to FIG. 14F, to provide a three-dimensional holographic TV system.

Because of the integrating effect of the human eye, photographic film, etc. an because each illumination image portion is independently formed in a non-coherent system, a scanned image such as with the raster scan in a conventional TV system is acceptable. In a holographic system, dependence is placed on interference between phases of different image portions. Therefore, it may be desirable to provide projection of a complete holographic image rather than projection of a scanned image.

In one embodiment, a holographic image may be scanned onto illumination amplifier 104 with control signal 133; may be temporarily stored on amplifier 104 such as with capacitors; and coherent source 100 may be de-energized during scanning. After the holographic image has been fully stored on amplifier 104, source 100 may be energized to project stored image 1435, 1437 as illumination 1414. In a multiple-channel system such as discussed with reference to FIG. 14B, the multiple channels may be scanned in a interleaved manner and may be sequentially projected. For example, while a red image is being scanned in the red channel R and therefore non-projecting, the green channel G and blue channel B may be projecting green G and blue B images 1415. Such interleaved operation may be implemented in the form of a well-known refresh arrangement and image information to be scanned may be stored in memory 1464 performing a buffer or refresh function.

Because of said integration effect, the pulsed operation of the holographic system is analogous to the scanned operation of a conventional TV system. Pulsing of lasers and control thereof is well known in the art.

The projection feature of the present invention may be used in a recording embodiment, where screen 1451 may be an illumination sensitive medium 130 such as film, light sensitive paper, a phosphor surface, or other well-known illumination sensitive mediums, where exposure of medium 130 is discussed in U.S. Pat. No. 3,986,022. Projection of an image onto medium 130 used in place of screen 1451 can provide a permanent record of information displayed with amplifier 104. In this recorder embodiment, amplifier 104 may be a physically small element such as one-square-inch television image or may be a physically large element such as a ten-square-inch arrangement for greater resolution. Post-optics 1436 may magnify or reduce image 1435, 1437. Magnification of a small image may be provided for using a smaller, lower resolution amplifier 104 in conjunction with a recorded image to be used by an operator such as on an 8½-by-11-inch page. Alternately, the system may be used for microfilm reproduction wherein a high resolution image 1414 is required and wherein image 1414 is very small for printing on microfilm. For this embodiment, illumination amplifier 104 may be large for providing greater image resolution and post-optics 1436 may provide illumination image reduction capability to print or record a high resolution miniature image 1414 on microfilm.

In another embodiment, post-optics 1436 may include a scanner for scanning image 1435 onto screen or medium 1451. The scanner may be a well-known prior art electro-mechanical scanner such as used in Xerox copiers and OCR systems or may be the electro-optical scanner discussed in application Ser. No. 727,330 with reference to FIG. 12 therein and as further discussed herein. In this embodiment, the scanner may scan an image such as a rectangular image across screen or medium 1451 as discussed for the photoplotter with reference to FIGS. 8 and 10 in U.S. Pat. No. 3,986,022. Alternately, image 1435, 1437 from amplifier 104 may be continuously changing as it is scanned across screen 1451 or medium 130. For example, control signal 133 may control a sequence of alpha-numeric characters which are scanned across a screen or medium 1451 for displaying or recording alpha-numeric information, wherein each scanned position may correspond to a different character commanded by signal 133, as discussed with reference to FIG. 12B of application Ser. No. 727,330.

The TV system of the present invention includes many additional advantages implicit in the small size, simplicity, and projection aspects. For example, this TV set may be used in a manner similar to common slide projectors and movie projectors wherein post-optics 1436 may include zoom capability, screen 1451 may be a portable screen or a wall and projector 1410–1412 may be a portable TV projector for projecting colored TV pictures on various types of screens and walls. Post-optics 1436 may also include well-known focusing optics as is common in slide projectors for focusing image 1414 on screen 1451 to provide projection from different distances and positions.

A high-intensity low-power portable embodiment of the TV system of the present invention may be provided, wherein source 100 constitutes the high-power dissipation element of the system and may be implemented as a flame-type lamp and wherein power-consuming electronics in projector 1410 may be powered with batteries. Lamp 100 may be a gas lamp or other lamp such as used on searchlights, lanterns, and in lighthouses to provide high-intensity illumination without electrical power consumption. Integrated circuit electronics may be used to drive illumination amplifier 104, where typical illumination amplifiers such as liquid crystals have bery low power dissipation and wherein integrated circuit electronics do not need high voltage and high powdered drives usually required for conventional television sets and therefore may be provided in a low-power battery-operated portable configuration.

Flexibility of the instant projection TV arrangement permits operation with many different screens including a self-contained screen for close viewing and a remote projection screen for audience-type viewing. Illumination intensity may be controlled such as a function of the viewing screen using pulse or amplitude modulation as signal 132 to source 100 or signal 133 to illumination amplifier 104. Portable screens may be used such as a removable self-contained screen for self-contained viewing and a remote screen such as a folding slide projector screen for audience viewing. Use of both, a removable self-contained screen and a portable remote screen, in conjunction with zoom and focusing capability in post-optics 1436 permits adaptation to many different viewing situations.

In another embodiment, illumination amplifier 104 may be coupled to provided illumination to an illumination sensitive medium such as photographic film or a phosphorus screen using fiber optic techniques such as used on the Honeywell VISICORDER. Use of an illumination diffuser as a projection screen at the remote end of a fiber optic bundle permits high intensity illumination from a small image to enter the source end of a fiber optic bundle, where divergence of the fiber optic strands permits a larger image to be projected or conducted from the destination end of the fiber optic strands to a larger screen (or alternately a smaller screen) for display purposes.

One traffic control system has been described in U.S. Pat. No. 3,986,022; wherein an alternate embodiment or additional features for the said previously disclosed embodiment are discussed below. The illumination amplifier projection arrangement discussed above may also be used for traffic control as a traffic light by projecting colored signals, alpha-numeric characters, symbols, and other information on traffic control panels and display screens. This embodiment may use the ambient illumination feedback, color control, projection control, and other features of the present invention as applied to traffic control systems.

The pictorial image feature of the present invention exemplified with a TV projection system may also be used for hardcopy recording of pictorial information. For example, use of an illumination sensitive medium 130 included in screen 1451 permits recording of pictorial information such as in a facsimile machine, a pictorial copier, or other such systems.

In the multi-beam embodiment, one beam may be used for operator viewing of a projected image and another beam may be used for recording of that image. For example, in a TV system used for projection viewing, it may be desired to record an image. Therefore, an illumination amplifier shutter may be used to expose an illumination sensitive medium with an alternate beam or with a redirected primary beam such as discussed for the single-lens reflex camera with reference to FIG. 9 of U.S. Pat. No. 3,986,022. Said reflex camera provides viewing to set up the picture and recording to expose the illumination sensitive medium using a single directionally controlled image beam. Alternately, a plurality of beams may be provided for simultaneous viewing and recording. Therefore, in accordance with this feature of the present invention, a system is provided for viewing an image and for recording an image using illumination amplifier devices such as a liquid crystal arrangement.

A plurality of controllable segments have been described relative to photoplotter and camera-type systems with reference to FIGS. 8A–8C and for a character display system such as with reference to FIG. 6 of U.S. Pat. No. 3,986,022 and further with reference to FIG. 12B of copending application Ser. No. 727,330. In an alternate embodiment, these segment illumination control arrangements may be implemented with the image control arrangement discussed for the image projection system such as for TV receivers. For example, the resolution of the TV image control system provides rectangular images at a very large number of angles relative to the 45-degree angular increments discussed with reference to FIG. 8A of U.S. Pat.No. 3,986,022 and may provide a very large number of different types of characters for a character generator in addition to a common set of alpha-numeric characters. Further, aperture control such as discussed with reference to FIGS. 8B and 8C of U.S. Pat. No. 3,986,022 may be provided with significantly greater resolution by using a large number of illumination amplifier segments compared to the three segments shown in said FIGS. 8B and 8C.

DISCLOSURE FROM APPLICATION Ser. No. 860,277

Materal filed with the present application has been cancelled and incorporated by reference from related application Ser. No. 860,277. This material includes sections entitled Alternate Scanner Embodiment; Spacial Control Of Illumination; Audience Display Systems; Additional Features; Further Considerations; Electro-Optical Thermal Design; Large Panel Construction; and Antecedent Basis For Projection Disclosure; which material can be found at pages 197 through 246 in related application Ser. No. 860,277 and which material is herein incorporated-by-reference therefrom as if fully set forth at length herein. Figures herein are described in detail in this material that is incorporated-by-reference.

PULSE MODULATED CONTROL

Pulse modulated control can be implemented with the system of the present invention for various uses exemplified by machine control and illumination control; as discussed in the referenced patent applications, as is well known in the art, and as further discussed herein. Although pulse modulation may herein be exemplified with pulse-width-modulation, it is herein intended that pulse-width-modulation be exemplary of other types of pulse modulation such as pulse-rate-modulation, pulse-code-modulation, and other types of pulse modulation.

A pulse modulation arrangement for use with a sound system such as a high fidelity and/or stereo type sound system will now be discussed with reference to FIG. 1A of U.S. Pat. No. 4,016,540. Data processor 112 can generate control signals such as whole number and discrete control signals 123 and 126 to interface electronics such as elements 120–122 and to device 124 which can be a pulse-width-modulated sound system.

For example, machine 124 can be a sound transducer such as a speaker and electronic devices 120-122 can be pulse-width-modulated amplifiers and controls used in place of the pulse-width-modulated servos which are discussed in the referenced patent applications. Alternately, pulse modulated digital signals can be generated with data processor 112 such as with a discrete output signal which can be signal 101 to interface device 100. In an embodiment where signal 101 is a pulse modulated signal, element 102 can be a power amplifier to generate pulse modulated signal 103 as a power signal to drive transducer 104 to generate sound signal 105. Use of a data processor to generate a pulse modulated output signal such as with a discrete signal is discussed in referenced application Ser. No. 134,958 at page 22 line 2 to page 23 line 15 and elsewhere in the referenced patent applications. The above-described arrangement can be used for a sound response system such as discussed with reference to interface 100 (FIG. 1A) which may be used for a toy, a game, or multitudes of other uses some of which are discussed in referenced U.S. Pat. No. 4,016,540. Further uses of this pulse modulation arrangement will now become obvious from the teachings herein.

Pulse-width-modulation has been discussed in detail in the referenced patent applications for a machine control embodiment and for an illumination control embodiment, wherein these disclosures have been incorporated herein by reference. For example, a pulse-width-modulated arrangement has been disclosed in referenced application Ser. No. 101,881 particularly with reference to FIGS. 1 and 16-19 therein; at page 33 lines 13-27, page 85 lines 23-25, page 86 lines 7-24, and page 88 lines 11-15; and elsewhere therein. Further, a pluse-width-modulation arrangement has been disclosed in referenced application Ser. No. 134,958 particularly at page 3 lines 21-28, page 6 lines 14-24, and page 22 line 2 to page 23 line 15, and elsewhere therein. Yet further, a pulse-width-modulated arrangement has been disclosed in referenced application Ser. No. 135,040 particularly at page 10 lines 10-15, page 18 lines 16-26, page 22 lines 1-28, page 24 lines 14-28, page 26 lines 10-16, page 31 line 4 to page 32 line 5, and elsewhere therein. Still further, a pulse-width-modulation arrangement has been disclosed in referenced application Ser. No. 246,867 particularly in FIGS. 4A and 4B; at page 24 lines 27-33 and page 27 line 1 to page 34 line 30; and elsewhere therein. Yet further, a pulse-width-modulated arrangement has been disclosed in referenced application Ser. No. 302,771 particularly with reference to FIGS. 5, 6, and 8; at page 21 line 30 to page 22 line 2 and page 57 line 1 to page 67 line 24; and elsewhere therein. Still further, a pulse-width-modulated arrangement has been disclosed in referenced applications Ser. No. 366,714; Ser. No. 727,330; and Ser. No. 730,756 particularly with reference to FIGS. 2 and 6E and at page 16 lines 10-19, page 17 line 1 to page 21 line 15, page 46 lines 18-30, and page 48 lines 1-34; and elsewhere therein and further with reference to applications Ser. No. 727,330 and Ser. No. 730,756 particularly at page 172 lines 9-25 and elsewhere therein.

As an alternate embodiment to the D/A converter of the interface device, a pulse modulated or other duty cycle modulated arrangement can be used. Such a duty cycle arrangement provides particular advantages, where a duty cycle device may be a digital device which may be more compatible with the digital electronics of the digital audionic system than would by a hybrid D/A converter arrangement. Various pulse modulated devices such as pulse-width-modulated devices are set forth in the copending applications in the chain of related applications which are incorporated by reference such as for the pulse-width-modulated servo drives of referenced applications Ser. No. 101,881; Ser. No. 134,958; Ser. No. 135,040; Ser. No. 339,817 now U.S. Pat. No. 4,034,276; and Ser. No. 339,688 and for illumination control in referenced applications Ser. No. 366,714 now U.S. Pat. No. 3,986,022; Ser. No. 727,330; and Ser. No. 730,756 set forth a pulse-width-modulated arrangement in FIGS. 2B, 2C, and 2D therein. Further, various pulse-width-modulated drives are commercially available and may be used with the system of the present invention for output transducer drivers in place of the D/A converter arrangement discussed herein.

In one embodiment such as discussed herein with reference to FIG. 17, a pulse-width-modulated signal may be generated with a counter such as by loading the output digital number into the counter and permitting the counter to count-down to zero. When the counter counts-down to zero, detection of the counter zero condition or the counter overflow condition can be used to reset a flip-flop. The flip-flop can be set at the start of the new cycle. Therefore, the output of the flip-flop set at the beginning of a cycle and reset after a controlled period of time provides a pulse-width-modulated output signal to drive an output transducer. Alternately, the pulse-width-modulated signal can be generated under program control of the computer, where the computer can set the flip-flop at the beginning of a cycle and can provide a program time delay for resetting the flip-flop thereby performing the same function as the counter described above; such as discussed in greater detail in the related applications referenced herein.

Further, the pulse modulated servo arrangement of the referenced patent applications set forth interface register and counter arrangements for interfacing a computer to a servo. These arrangements are exemplary of interfacing a computer to a sound generation arrangement wherein servo electronics 120-122 of the referenced patent applications is exemplary of sound interface electronics and wherein machine 124 of the referenced patent applications is exemplary of a sound transducer such as a speaker.

The audionic system of U.S. Pat. No. 4,016,540 has been discussed in a preferred embodiment using a digital-to-analog converter 102 to interface between data processor 112 and transducer 104 (FIG. 1A). Alternately, other arrangements can be used including analog, hybrid, and digital arrangements as disclosed in U.S. Pat. No. 4,016,540 particularly at column 7 lines 15-24 and also at column 5 line 67 to column 6 line 19 and elsewhere therein. An analog embodiment is exemplified by the direct outputting of analog signals stored in an analog ROM or other analog memory as discussed in referenced application Ser. No. 812,285 such as at page 41 line 16 to page 42 line 7 and elsewhere therein. A hybrid (analog and digital) embodiment is characterized by the digital-to-analog converter arrangement discussed in U.S. Pat. No. 4,016,540 with reference to FIG. 3. A digital embodiment can be implemented as the pulse modulated embodiment discussed herein such as with reference to FIGS. 9A and 9B. Further, a digital embodiment is illustrated in the referenced applications such as applications Ser. No. 101,881; Ser. No. 134,958; Ser. No. 135,040; Ser. No. 302,771; etc such as for controlling analog servos with pulse-width-modulated signals as discussed elsewhere herein wherein digital commands are loaded into counters and registers for controlling pulse-width-modulated servos. Many other emobdiments will now become obvious to those skilled in the art from the teachings herein.

TIME-DOMAIN PULSE MODULATION

A time-domain pulse modulator will now be discussed for a preferred embodiment using the monolithic computer of the system of the present invention for generating a pulse-width-modulated signal under program control. Other pulse modulation arrangements will now become obvious from the teachings herein such as using program controlled arrangements as described herein and as described in related application Ser. No. 134,958 at page 22 line 2 to page 23 line 15; or using hardwired arrangements as disclosed in the related patent applications referenced herein; or using other computers, programs, and/or arrangements as will now become obvious from the teachings herein.

A program controlled pulse-width-modulation arrangement will now be discussed with reference to FIGS. 17A and 17B. An interface arrangement 971 consistent with the data processor of referenced application Ser. No. 101,881 is illustrated in FIG. 9A. A flow diagram 976 for generating a pulse-width-modulated signal with arrangement 971 (FIG. 17A) is illustrated in FIG. 17B. Arrangement 971 constitutes set-reset flip-flop 972 which is set by discrete output signal DO-8, reset by discrete output signal DO-9, and used to control device 974 with output signal 975 from flip-flop 972. Device 974 can be an audio speaker, a servo, or other device controlled with a pulse modulated signal. Amplifier 973 can be used to amplify output signal 975 to drive output device 974. Feedback signal DI-8 provides feedback on the state of flip-flop 972 to the data processor. The data processor generates signal DO-8 to set flip-flop 972 and generates signal DO-9 to reset flip-flop 972 under program control using discrete output instructions. A time delay between generating the DO-8 signal and the DO-9 signal controls the time period that output signal 975 is in the high state or the duty cycle of output signal 975.

Therefore, the duty cycle of output signal 975 can be directly controlled by the data processor under program control. One form of program control which is exemplary of a wide range of methods is discussed herein with reference to FIG. 17B.

Flow diagram 976 (FIG. 17B) illustrates one method for generating pulse-width-modulated signal 975 under program control. The computer enters subroutine 976 through operation 977 and exits subroutine 976 through operation 983 with well-known subroutine operations. For example, ENTER operation 977 can include a calling sequence such as saving the return address to the main program or to the executive program and EXIT operation 983 can include fetching the stored return address and transferring back to the main program location defined with the return address, as is well known in the computer programming art.

After entering subroutine 976 through operation 977, the program initializes the subroutine such as by loading parameters or constants into various registers and memory locations. For example, a time delay word that defines the width of the pulse-width-modulated signal is defined as the $N_o$ parameter which is loaded into the N scratchpad register; wherein this scratchpad register designation is provided for convenience and may be assigned to any scratchpad register or other storage in the computer. The time delay number $N_o$ can be provided as a stored constant, or generated under program control, or generated by various known methods to determine the time delay between discrete output signals which determines the width of output pulse 975 and therefore the information content of the pulse-width-modulated signal.

The program generates the DO-8 signal with a discrete output instruction to set flip-flop 972 with operation 979 and then executes a time delay iterative routine using decrement operation 980 and test operation 981 to control the width of pulse-width-modulated output signal 975. The N-parameter is successively decremented in operation 980 to provide a time delay and tested with operation 981 to detect when the time delay has expired. Operations 980 and 981 can be implemented with a decrement and transfer or non-negative instruction, where the N-parameter in the N-register is decremented and the program operation transferred until the N-parameter is decremented to a negative number. The conditional transfer on the N-parameter being non-negative is shown by the looping back from the test operation 981 to the decrement operation 980 along the positive path. When the N-parameter has been decremented to a negative number, the conditional transfer is disabled and the program operations continue in sequence to operations 982 and 983.

Operation 982 discontinues the pulse-width-modulated output signal 975 by generating the DO-9 signal with a discrete output instruction to flip-flop 972. Program operation then continues to exit operation 983 to exit the subroutine.

OPTICAL EFFECTS

Various optical effects can be provided for electronic devices such as for electronic toys and games. In a preferred embodiment, these optical effects can be provided with liquid crystal optical devices under control of a microcomputer such as disclosed in the referenced patent applications; wherein this preferred embodiment is intended to exemplify generalized optical effects that can be controlled with any computer or circuit arrangement. Alternately, non-microcomputer related control arrangements can be implemented in accordance with the teachings of the present invention using optical devices in general and control circuits in general that are exemplified by the microcomputer controlled liquid crystal arrangement of this preferred embodiment.

Optical effects will now be exemplified with a liquid crystal eyelid embodiment for a toy doll with reference to FIG. 17C. Illustration 984 shows liquid crystal eyelids 986 controlling illumination 987 to illuminate eye patterns 988. Illustration 984A shows liquid crystal eyelids 986A being controlled to be transmissive for viewing eye patterns 988 indicative of open eyes and illustration 984B shows liquid crystal eyelids 986B controlled to be non-transparent for obscuring eye patterns 988 indicative of closed eyes. Eye patterns 988 may be any known eye pattern arrangement such as painted or otherwise colored eyes such as conventionally used in dolls. Liquid crystal elements 986 can be implemented with liquid crystal techniques discussed in U.S. Pat. No. 3,986,022 and co-pending applications Ser. No. 727,330 and Ser. No. 730,756. The two liquid crystal eyelids 986 can be controlled together to be transparent and non-transparent to provide an awake effect and a sleeping effect respectively. Further, the two liquid crystal eyelids 986 can be controlled separately such as for controlling one of the two eyelids to be transparent while the other eyelid is controlled to be opaque and then transparent for a winking effect. Further, eyelids 986 can be controlled in various ways such as multiple sequential on and off transparent and non-transparent control operations to provide a fluttering eye effect. Yet further, eyelids 986 can be implemented in segments such as to provide half-closed eyelid effects. Many other effects will now become obvious from the teachings herein.

Control arrangements are discussed in detail in said patent and in said two copending applications such as pulse modulated control, digital control, and analog control. Further, in a preferred embodiment, the microcomputer of the present invention can be used to control devices 986 such as discussed in said patent and two copending applications such as for a camera control embodiment and a pulse modulation control embodiment discussed therein.

A simplified control arrangement 985 (FIG. 17D) will now be provided to exemplify operation of the liquid crystal doll eye embodiment. Liquid crystal eyes 986 can include a first eye element 986C and a second eye element 986D being excited with excitation signal EXCIT under control of switches 989 and 990. Switch 989 provides dual eyelid control and switch 990 provides single eyelid control. Dual eyelid control switch 989 may be a well-known double-pole double-through(DPDT) type switch where both contacts operate together to control both LCD elements together for both eyelids to be opened or closed together. Switch 989 may be implemented as a gravity switch. The gravity switch will open when the doll is upright to provide an open eyelid condition 984A and will close when the doll is reclining to provide a closed eyelid condition 984B. Such gravity switches are well known in the art such as mercury switches and such as safety switches exemplified with the switch in Sears Kenmore portable heater Model No. 771-72230. Single eyelid control switch 990 may be a well-known single-pole double-through (SPDT) switch with a center off position for selecting either element 986C to be non-transmissive when in the up position, or to select element 986D to be non-transmissive when in the down position, or to select both elements 986C and 986D to be transmissive when in the center-off position. Corresponding terminals of switches 989 and 990 are connected together for control of elements 986C and 986D in accordance with the dual eye control and single eye control arrangements discussed above.

Further, liquid crystal devices 986 can be implemented as eyeglasses (either for a doll or for a human) which may be controlled to be transmissive for conventional eyeglasses and opaque or semi-opaque for sunglasses.

Still further, eyelids 986 and eye patterns 988 can be combined into a single element being a liquid crystal element having concentric controllable sub-elements. Control of an inner concentric element to be continuously non-transmissive, control of the middle concentric element to be partially transmissive, and control of the outer concentric element to be transparent provides the effect of an open eye and control of all elements to be fully non-transmissive provides the effect of a closed eye. Such a concentric circle control arrangement is discussed in the embodiment of a shutter and aperture for a camera in U.S. Pat. No. 3,986,022 and in copending applications Ser. No. 727,330 and Ser. No. 730,756 with reference to FIG. 8 therein.

Optical effects for toys and games will now be exemplified with a three-dimensional illumination control arrangement 991 (FIG. 17E). For simplicity of discussion, this embodiment will be discussed in the arrangement of the transparent person toy. Such a toy has been implemented in the prior art using transparent plastic elements mounted within each other and formed to appear as internal parts therebetween such as for internal organs presented in a transparent doll type figure. In this arrangement, element 994 is shown internal to element 993 which is shown internal to element 992. Each element 992–994 includes liquid crystal illumination control elements which are controlled to be transmissive or non-transmissive. Switch 995 applies excitation signal EXCIT to either outer element 992 to make outer element 992 non-transmissive, to middle element 993 to make middle element 993 non-transmissive, and/or to neither element 992 nor 993 to permit viewing of inner element 994 through transparent elements 992 and 993. Therefore, liquid crystal arrangements can be provided internal to other liquid crystal arrangements for selective viewing of internal elements as a function of excitation of the more outer elements.

The projection display arrangement of copending application Ser. No. 730,756 may be used to provide large screen display capability for enhanced effectiveness in combination with a small low-cost illumination amplifier device. This game embodiment exemplifies the general concept of projection displays for enhanced utility and economy. A game projection display arrangement will now be discussed with reference to FIG. 14A of application Ser. No. 730,756. An electronic game can be implemented having an illumination amplifier display such as a chess game, a "battleship" game, or other games. The illumination amplifier display can be implemented as illumination amplifier 104 in image generator 1450 as part of projector 1410 for projection of the display as illumination 1414 on screen 1451.

Other uses of displays for toys will now become obvious from the teachings herein. For example, projection LCD displays (or non-projection LCD displays) can be used for board games such as bingo, battleship, monopoly, tic-tac-toe, dungeons and dragons, etc.

Further, improved electronic toy and game arrangements are discussed in referenced applications Ser. No. 849,733 and Ser. No. 849,812 at pages 102–105 therein which is herein incorporated by reference.

LIGHT ORGAN

The arrangements described herein may be used for an illumination amplifier light organ. Light bulb light organs are well known in the art such as used in conjunction with sound systems such as stereo hi-fi systems. In a preferred embodiment, the illumination amplifier light organ can use the projection IAD, color IAD, spacial control arrangement, and other features disclosed herein in combination therewith.

In a preferred embodiment, the light organ is configured as a colored projection LCD arrangement implemented as part of a sound system, wherein the projected pattern is projected on a wall, and/or ceiling, and/or screen, and/or other structures.

The light organ of the present invention can be controlled by audio signals as is well known for prior art light organs. Alternately, the light organ of the present invention can be controlled independent of a sound system, independent of sound, etc. Independent control can be provided from a recording medium such as from signal superimposed on an audio recording such as signature signals that are separable from the audio recording, or from signals recorded on a separate track as with well-known multiple-track recording devices characterized by cassette recorders, eight-track tape recorders, etc. In such an independent embodiment, a light display can be provided that is synchronized with but independent of a sound presentation.

FURTHER SPACIAL CONTROL FEATURES

The spacial control arrangement discussed with reference to FIG. 15 can be used in many other embodiments and applications, some of which will now be described below. Spacial control can be implemented with resistive electrodes, variable thickness electro-optical material, etc; wherein the resistive electrode arrangement will be discussed for simplicity as exemplary of the other methods.

A two degree of freedom arrangement can be provided with resistive electrodes on both sides of the electro-optical material such as by desposition on each substrate, as is well known in the art for conductive electrodes. A voltage gradient across a pair of electrodes can be used to provide a transparent window or a non-transparent window that can be controlled in its position by adjusting the voltages on the two resistive electrodes. Such an arrangement may be utilized as a scanner by scanning a transparent window or, in an alternate embodiment, by scanning an opaque window. The dimensions of the window can be controlled with the magnitudes of the voltages and the position of the window can be controlled with the relationships between the voltages applied to the two electrodes.

In one embodiment, the resistive electrodes provide a constant resistivity for a constant resistive gradient. In an alternate embodiment, the resistive electrodes provide a variable resistivity for a variable resistive gradient. In yet another embodiment, the resistive electrodes interconnect conductive electrode segments; wherein the conductive electrode segments are controlled by the excitation of the conductive and resistive electrode combination; and wherein particular electrode shapes can be provided such as with the conductive electrode segments instead of merely a progressive bar graph or other such simple effect. In this embodiment, the resistive electrode portions may be very narrow and the conductive electrode portions may be relatively wide, where the display can be dominated by the conductive electrode portions. Therefore, the resistive electrode portions can provide the excitation-sensitive control of the conductive electrode portions, wherein the conductive electrode portions can dominate the display over the resistive electrode portions or to the virtual exclusion of the resistive electrode portions.

For example, when the excitation voltage occurs at the threshold of a conductive portion, the excitation voltage would cause the conductive region after the resistive region to "pop" into the display or to move more rapidly into the display, wherein a linear increase in voltage would cause a non-linear increase in illumination or display. For example, a thin resistive electrode between display elements could cause a thin minimal illumination effect until a conductive display position is reached; where the display element associated with the conductive region would "pop" into visual appreearance as the voltage threshold is reached.

Therefore, use of a non-linear resistive gradient and/or conductive regions and/or a linear resistive gradient can provide useful optical effects.

If the above resistive and conductive electrode arrangement is used in combination with the dual-resistive electrode embodiment for scanning an optical window, a particular one of a plurality of conductive electrode portions may be selected as a function of the excitation voltage. In this embodiment, voltage-scanned elements can be selected as contrasted to the conventional approach of logically selecting elements; thereby reducing the number of electrodes, the electronic circuit complexity, etc and providing an analog scanning, selection, etc capability.

The controllable or scanned window discussed above can be utilized for a reading machine, wherein a student is taught reading by controlling visual access to printed material. For example, a page of printed material is provided under an IAD. Control of size and position of a transparent window can be controlled to provide visibility of a word, a portion of a word, or a plurality of words by controlling the relative excitations on two resistive electrodes. The window size can be controlled as a function of the amount of written material to be displayed and the position of the window can be controlled as a function of the portion of the written material to be displayed. The window can be dynamically positioned over the written material, moving from display portion to display portion under control of an electronic control device to teach a student to read by visually following the window. Voltages can be controlled with a digital control device such as the computer disclosed herein generating digital words to a pair of A/D converters for dynamically controlling the transparent window; wherein such A/D converter control is discussed with reference to FIG. 9B.

For the resistive electrode embodiment, capacility can be provided with non-transparent or with transparent resistive electrodes. In a non-transparent resistive electrode embodiment, the IAD is used in a reflective mode; wherein the non-transparent resistive electrode is provided as the electrode associated with the reflective side of the IAD and wherein a transparent electrode such as a transparent conductive electrode is associated with the transmissive side of the IAD.

SCOPE AND DEFINITIONS

The invention disclosed herein is presented in preferred embodiments of illumination control arrangements to exemplify the inventive features, but the scope of this invention is much broader than illustrated with these preferred embodiments. Therefore, the scope is intended to be broadly interpreted to cover the general fields of illumination control.

Various publications may be used for providing background for this invention and for illustrating the prior art. The various subject areas and associated references for each subject area are listed below.

(1) Integrated circuit technology is described in the book *Integrated Circuits* by Raymond M. Warner, Jr. and James N. Fordemwalt (Editors) for McGraw-Hill Book Company (1965).

(2) Digital computer technology is described in the books
  (a) *Digital Computer Design* by Edward L. Braun for Academic Press (1963) and
  (b) *Digital Computer Design Fundamentals* by Yaohan Chu for McGraw Hill (1962).

(3) Digital computer programming is described in the books
  (a) *Programming: An Introduction to Computer languages and Techniques* by Ward Douglas Maurer for Holden Day Inc. (1968),
  (b) *Programming for Digital Computers* by Joachim Jeenal for McGraw Hill (1959), and
  (c) *Elements of Computer Programming* by Swallow and Price for Holt, Rinehart, and Winston (1965).
(4) Analog computer technology is described in the book *Methods for Solving Engineering Problems Using Analog Computers* by Leon Levine for McGraw Hill (1964).
(5) Servo technology is described in the book *Automatic Control Systems by Benjamin C. Kuo for Prentice-Hall (1962).
(6) Illumination technology is described in the books
  (a) *Optics, A Course For Engineers and Scientists* by Charles Williams and Orville Becklund for John Wiley and Sons Inc.,
  (b) *Optical Data Processing* by Arnold Roy Shulman for John Wiley and Sons Inc., and
  (c) *Optics* by Bruno Rossi for Addison-Wesley (1957).
(7) Integrated circuits are described in the book *The TTL Data Book For Design Engineers* from Texas Instruments Incorporated.
(8) Thermal design is described in the articles
  (a) *What's New in Cool(ing)? 1* by W. S. Hudspeth in the May 1977 issue of Electro-Optical Systems Design magazine at pages 32–37,
  (b) *A New Approach to High-Power Microstrip Attenuators* By Jerry McNeal and Larry Gordon in the October 1977 issue of Electronic Packaging and Production magazine at pages 109 and 110, and
  (c) *Cold-Plate Thermal Design, Analysis and Sizing* by Ira Leonard and Steven Axelband in the October 1977 issue of Electronic Packaging and Production magazine at pages 101–107.

Discussions on scope and definitions are provided in parent U.S. Pat. No 3,986,022 at column 56 line 14 to column 58 line 8 therein which is herein incorporated by reference.

The features of the present invention have been described for the preferred embodiment of an IAD, but these features may be applied to other illumination systems. For example, the pulse modulation arrangement can be applied to light emitting diode (LED) displays and to plasma displays to provide shades of intensity as discussed herein for the IAD embodiment. Further, the flat-plane IAD embodiment disclosed herein such as with reference to FIG. 6 can be used in conjunction with LED and plasma display devices.

Many features of the present invention are related to the machine control parent applications referenced herein. For example, a camera may be considered to be a machine and a photoplotter clearly bridges the technologies between a conventional photographic camera and a machine. Control of illumination and control of a machine, particularly with the microcomputer of the present invention and with other control arrangements are disclosed in detail in the chain of copending applications. Therefore, control of illumination and control of machines finds extensive basis in the instant application and in the chain of copending applications.

From the above description it will be apparent that there is thus provided a device of the character described possessing the particular features of advantage before enumerated as desireable, but which obviously is susceptible to modification in its form, method, mechanization, operation, detailed construction and arrangements of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. An illumination control system comprising:
   control means for generating a pulse modulated control signal, said control means including
   a. means for generating an analog input signal and
   b. means for generating the pulse modulated control signal in response to the analog input signal; and
   illumination amplifier means for controlling illumination in response to the pulse modulated control signal.

2. The system as set forth in claim 1 above, wherein said illumination amplifier means includes a liquid crystal device for providing controlled transmissivity in response to the pulse modulated control signal.

3. The system as set forth in claim 1 above, wherein said illumination amplfier means includes means for controlled reflectivity in response to the pulse modulated control signal.

4. The system as set forth in claim 1 above, wherein said system is a television receiver system.

5. The system as set forth in claim 1 above, wherein said pulse modulated signal generating means includes means for generating a pulse width modulated control signal in response to the analog input signal, wherein the control signal is a pulse width modulated control signal, wherein the pulse width modulated control signal has a pulse width characteristic that is related to amplitude of the analog input signal, and wherein the controlled illumination from said illumination amplifier means has an intensity characteristic that is related to the pulse width characteristic of the pulse width modulated control signal.

6. The system as set forth in claim 1 above, wherein the controlled illumination from said illumination amplifier means has an intensity characteristic that is related to an amplitude characteristic of the analog input signal.

7. The system as set forth in claim 1 above, wherein the controlled illumination from said illumination amplifier means has an illumination intensity characteristic that is related to modulation of said pulse modulated control signal.

8. An illumination control system comprising:
   analog means for processing an analog signal;
   pulse modulation means for generating a pulse modulated signal in response to the processed analog signal from said analog means; and
   illumination amplifier means for controlling intensity of illumination in response to the pulse modulated signal.

9. The system as set forth in claim 8 above, wherein said pulse modulation means includes means for controlling width of a pulse in response to amplitude of the processed analog signal and wherein the intensity controlled illumination from said illumination amplifier means has an intensity that is related to pulse width of the pulse modulated signal from said pulse modulation means.

10. An illumination control system comprising:
   illumination source for generating source illumination;
   electrical control means for generating an electrical control signal;
   a liquid crystal device for generating controlled illumination in response to the source illumination from said illumination source means and the electrical control signal from said electrical control means; and
   projection means for generating projection illumination in response to the controlled illumination.

11. The system as set forth in claim 10 above, wherein said projection means includes an optical lens for generating the projected illumination in response to the controlled illumination.

12. The system as set forth in claim 10 above, further comprising screen means for generating an illumination image in response to the projected illumination.

13. An illumination control system comprising:
   illumination amplifier means for controlling illumination and
   heat transfer means for removing heat from said illumination amplifier means.

14. The system as set forth in claim 13 above, further comprising control means for generating an electrical control signal, wherein said illumination amplifier means is responsive to the electrical control signal for controlling the illuminaton.

15. The system as set forth in claim 14 above, further comprising a high intensity illumination source for generating high intensity illumination, wherein said illumination amplifier means is arranged for controlling the illumination in response to the high intensity illumination from said illumination source.

16. The system as set forth in claim 15 above, further comprising projection means for projecting the controlled illumination from said illumination amplifier means.

17. An illumination control system comprising:
   illumination amplifier means for controlling illumination in response to an electrical control signal;
   means for generating the electrical signal; and
   means for cooling said illumination amplifier means.

18. The system as set forth in claim 17 above, wherein said cooling means includes forced air means for conductively cooling said illumination amplifier means with forced air flow.

19. The system as set forth in claim 17 above, wherein said cooling means includes a heat sink for transferring heat from said illumination amplifier means.

20. The system as set forth in claim 17 above, wherein said cooling means includes fluid conducting means for conducting cooling fluid to improve heat transfer from said illumination amplifier means.

21. The system as set forth in claim 17 above, wherein said cooling means includes integral cooling means for improving heat transfer from said illumination amplifier means, said integral cooling means being constructed as an integral part of said illumination amplifier means.

22. An illumination control system comprising an illumination amplifier for controlling illumination, said illumination amplifier including
   a. substrate means for containing electro-optical material,
   b. edge supporting means for supporting said substrate means at an outer edge, and
   c. internal supporting means for supporting said substrate means internal to the outer edge.

23. The system as set forth in claim 22 above, wherein said illumination amplifier includes a large panel illumination amplifier and wherein said internal supporting means includes supporting elements for providing the internal support.

24. The system as set forth in claim 22 above, further comprising means for mounting said illumination amplifier as a window of a building.

* * * * *

(12) EX PARTE REEXAMINATION CERTIFICATE (4977th)
United States Patent
Hyatt

(10) Number: US 4,471,385 C1
(45) Certificate Issued: Aug. 24, 2004

(54) ELECTRO-OPTICAL ILLUMINATION CONTROL SYSTEM

(75) Inventor: Gilbert P. Hyatt, P.O. Box 4584, Anaheim, CA (US) 92803

(73) Assignee: Gilbert P. Hyatt, Anaheim, CA (US)

Reexamination Request:
No. 90/001,867, Oct. 19, 1989
No. 90/002,541, Dec. 13, 1999

Reexamination Certificate for:
Patent No.: 4,471,385
Issued: Sep. 11, 1984
Appl. No.: 05/860,278
Filed: Dec. 13, 1977

Related U.S. Application Data

(63) Continuation-in-part of application No. 05/101,881, filed on Dec. 28, 1970, now abandoned, which is a continuation-in-part of application No. 05/134,958, filed on Apr. 19, 1971, which is a continuation-in-part of application No. 05/135,040, filed on Apr. 19, 1971, which is a continuation-in-part of application No. 05/229,213, filed on Apr. 13, 1972, now Pat. No. 3,820,894, which is a continuation-in-part of application No. 05/230,872, filed on Mar. 1, 1972, which is a continuation-in-part of application No. 05/232,459, filed on Mar. 7, 1972, which is a continuation-in-part of application No. 05/246,867, filed on Apr. 24, 1972, now Pat. No. 4,310,878, which is a continuation-in-part of application No. 05/288,247, filed on Sep. 11, 1972, now Pat. No. 4,121,284, which is a continuation-in-part of application No. 05/291,394, filed on Sep. 22, 1972, which is a continuation-in-part of application No. 05/302,771, filed on Nov. 1, 1972, which is a continuation-in-part of application No. 05/325,933, filed on Jan. 22, 1973, now Pat. No. 4,016,540, which is a continuation-in-part of application No. 05/325,941, filed on Jan. 22, 1973, now Pat. No. 4,060,848, which is a continuation-in-part of application No. 05/366,714, filed on Jun. 4, 1973, now Pat. No. 3,986,022, which is a continuation-in-part of application No. 05/339,817, filed on Mar. 9, 1973, now Pat. No. 4,034,276, which is a continuation-in-part of application No. 05/490,816, filed on Jul. 22, 1974, now Pat. No. 4,209,853, which is a continuation-in-part of application No. 05/476,743, filed on Jun. 5, 1974.

(51) Int. Cl.[7] ................................................. H04N 5/66
(52) U.S. Cl. ..................................................... 348/766

(56) References Cited

U.S. PATENT DOCUMENTS

| | | | | |
|---|---|---|---|---|
| 3,401,262 A | 9/1968 | Fergason et al. | ............ | 250/331 |
| 3,588,324 A | 6/1971 | Marie | .......... | 358/61 |
| 3,597,044 A | * 8/1971 | Castellano | ............. | 252/299.1 |
| 3,605,594 A | 9/1971 | Gerritseu | ............. | 354/75 |
| 3,627,408 A | 12/1971 | Fergason | ............. | 353/84 |
| 3,688,025 A | * 8/1972 | Whitemore, Jr. | ............ | 386/103 |
| 3,723,651 A | 3/1973 | Gorog | ............. | 358/236 |
| 3,723,739 A | 3/1973 | Horton | ............. | 250/331 |
| 3,742,600 A | * 7/1973 | Lowell | ............. | 29/592.1 |
| 3,770,961 A | 11/1973 | Westell | ............. | 250/331 |
| 3,824,003 A | 7/1974 | Koda et al. | ............. | 350/160 |
| 3,862,360 A | 1/1975 | Dill et al. | | |
| 3,895,866 A | 7/1975 | de Quervain et al. | ......... | 423/657 |
| 3,899,786 A | 8/1975 | Gruebel et al. | ............. | 340/336 |
| 3,986,022 A | 10/1976 | Hyatt | ............. | 364/205 |
| 4,006,968 A | 2/1977 | Ernstoff et al. | ........ | 350/160 LC |
| 4,060,848 A | 11/1977 | Hyatt | ............. | 364/200 |
| 4,087,687 A | 5/1978 | Bean | ............. | 564/190 |
| 4,090,219 A | 5/1978 | Ernstoff et al. | ............. | 358/98 |
| 4,121,284 A | 10/1978 | Hyatt | ............. | 364/200 |
| 4,127,322 A | 11/1978 | Jacobson et al. | ............. | 353/31 |
| 4,239,349 A | 12/1980 | Scheffer | ............ | 350/347 R |
| 4,310,878 A | 1/1982 | Hyatt | ............. | 364/183 |
| 4,364,110 A | 12/1982 | Hyatt | ............. | 364/107 |
| 4,370,720 A | 1/1983 | Hyatt | ............. | 364/474 |
| 4,531,182 A | 7/1985 | Hyatt | ............. | 364/131 |
| 5,398,041 A | 3/1995 | Hyatt | | |
| 5,432,526 A | 7/1995 | Hyatt | | |

FOREIGN PATENT DOCUMENTS

| | | |
|---|---|---|
| JP | 47-9610 | 1/1972 |
| JP | 5277699 | 6/1977 |
| JP | 7769997 | 6/1977 |

OTHER PUBLICATIONS

Hendrickson et al; Television Projectors; Society of Photo–Optical Instrumentation Engineers; 3/17. 18/75.

Obert; Thermodynamics; McGraw Hill; 1948.

"Facsimile Printer Utilizing L.C. Cells" J. Tults of RCA Labs. (Society for Information Display).

"Liquid Crystal Matrix Displays" B J Lechner et al. pub. in Proceedings of the IEEE, pp. 1566–1579.

"L. C. & Photoconductor Image Converter" Assouline Pub. in Proceedings of the IEEE, pp. 1355–1357.

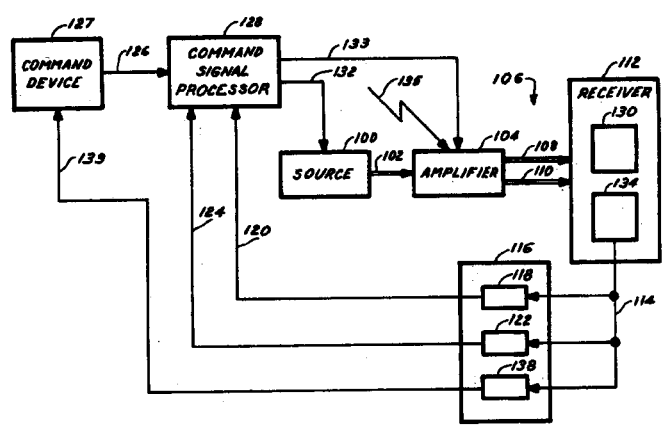

"L C. Display Devices" George Heilmeier pub. in Scientific American pp. 100–106.
"L. C. Light Values" D.L. White et al pub in Electronic Letters pp. 837–839.
"L. C. In Optics" V.I. Lebedey et al. pub. in Soviet Journal of Optic Technology pp. 403–412.
"Summary: New Techn, in Video Displays" Alan Sobel pub. IEEE Tra on Consumer ELect. pp. 290–297.
Morozumi et al; "4.25–in and 1.5–in B/W and Full–Color LC Video Displays Addressed by Poly–Si TFT", SID84 Digest; pp. 315–318.*
Anderson, Lawrence K., "Projecting Images with Liquid Crystals," *Bell Laboratories Record*, Jul./Aug. 1974, pp. 223–229.
Lines, M.E. and A.M. Glass, Excerpt from "Principles and Applications of Ferroelectrics and Related Materials," 1970.
Lechner, B.J., et al., "Liquid Crystal Matrix Displays," *Proceedings of the IEEE*, Nov. 1971, pp. 1566–1579.
White, D.L. et al., "Liquid Crystal Light Valves," *Electronic Letters*, Dec. 1970, vol. 6, No. 26, pp. 837–839.
Sobel, Alan, "Summary: New Techniques in Video Displays," *IEEE Transactions on Consumer Electronics*, Aug. 1975, vol. CE–21, No. 3, pp. 290–297.
Robertson, Angus, "Projection Television," *Wireless World*, Sep. 1976, vol. 82, No. 1489, pp. 47–52.

\* cited by examiner

*Primary Examiner*—Michael A. Lee

(57) ABSTRACT

Control of illumination with illumination amplifer devices provides a basis for implementing various types of illumination systems. Also illumination amplifiers in closed illumination servo loops provide improved illumination control. An illumination control system provides precise control of camera operations for photographic and photoplotter applications. Illumination amplifier devices are used in conjunction with electronic control circuits to provide flexibility and precision in camera systems, reducing reliance on prior art mechanical devices.

Illumination control circuits are presented in the form of digital gates and flip-flops and in the form of analog computational elements to provide illuminaton computer systems. In addition, a batch fabricated illumination computer arrangement is presented for improved implementation of illumination control systems.

Illumination amplifers are further configured for control of illumination in buildings and automobiles. Various types of devices such as windows, shutters, shades and visors are configured with illumination amplifers to provide electronic control of illumination.

Batch fabricated display arrangements are provided having an illumination source integral with an illumination amplifier for low cost, small volume, and flexibility. Also, colored display arrangements are provided for control of colors with illumination amplifier devices.

A projection illumination amplifier arrangement is provided having high-intensity large-screen capability and heat transfer design for cooling.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–24 are cancelled.

\* \* \* \* \*